(12) United States Patent
Ryu et al.

(10) Patent No.: US 11,670,565 B2
(45) Date of Patent: Jun. 6, 2023

(54) SEMICONDUCTOR PACKAGE WITH HEAT DISSIPATION MEMBER

(71) Applicant: SAMSUNG ELECTRONICS CO., LTD., Suwon-si (KR)

(72) Inventors: Hyo-Chang Ryu, Cheonan-si (KR); Chulwoo Kim, Incheon (KR); Juhyun Lyu, Cheonan-si (KR); Sanghyun Lee, Cheonan-si (KR); Yun Seok Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 18 days.

(21) Appl. No.: 17/307,181

(22) Filed: May 4, 2021

(65) Prior Publication Data

US 2021/0384100 A1 Dec. 9, 2021

(30) Foreign Application Priority Data

Jun. 3, 2020 (KR) ........................ 10-2020-0067277

(51) Int. Cl.
*H01L 23/367* (2006.01)
*H01L 25/065* (2023.01)
*H01L 23/00* (2006.01)
*H01L 25/00* (2006.01)

(52) U.S. Cl.
CPC .......... *H01L 23/3675* (2013.01); *H01L 24/32* (2013.01); *H01L 25/0655* (2013.01); *H01L 23/367* (2013.01); *H01L 25/50* (2013.01); *H01L 2224/32237* (2013.01); *H01L 2924/3511* (2013.01)

(58) Field of Classification Search
CPC . H01L 23/3675; H01L 24/32; H01L 25/0655; H01L 2224/32237; H01L 2924/3511; H01L 24/10; H01L 25/0652; H01L 23/49816; H01L 23/42; H01L 23/5385; H01L 25/165; H01L 25/18; H01L 23/3735; H01L 23/3736; H01L 23/3737; H01L 23/367; H01L 23/373; H01L 24/97; H01L 25/50
See application file for complete search history.

(56) References Cited

U.S. PATENT DOCUMENTS

| 7,615,862 B2 | 11/2009 | Huang et al. |
| 9,076,754 B2 | 7/2015 | Hung et al. |
| 9,330,999 B2 | 5/2016 | Fitzgerald et al. |
| 2009/0127700 A1 | 5/2009 | Romig |

(Continued)

*Primary Examiner* — Patricia D Valenzuela
(74) *Attorney, Agent, or Firm* — Lee IP Law, P.C.

(57) ABSTRACT

A semiconductor package includes a first substrate, a first chip structure and a second chip structure spaced apart from each other on the first substrate, a gap region being defined between the first and second chip structures, and a heat dissipation member covering the first chip structure, the second chip structure, and the first substrate, the heat dissipation member including a first trench in an inner top surface of the heat dissipation member, wherein the first trench vertically overlaps with the gap region and has a width greater than a width of the gap region, and wherein the first trench vertically overlaps with at least a portion of a top surface of the first chip structure or a portion of a top surface of the second chip structure.

20 Claims, 19 Drawing Sheets

(56) References Cited

U.S. PATENT DOCUMENTS

| | | | |
|---|---|---|---|
| 2015/0035135 A1* | 2/2015 | Hung | H01L 23/3672 |
| | | | 257/712 |
| 2015/0061104 A1* | 3/2015 | Takahashi | H01L 23/04 |
| | | | 257/704 |
| 2018/0350754 A1* | 12/2018 | Huang | H01L 21/4853 |
| 2020/0020606 A1 | 1/2020 | Kim et al. | |
| 2021/0233825 A1* | 7/2021 | Li | H01L 24/32 |

\* cited by examiner

SEMICONDUCTOR PACKAGE WITH HEAT DISSIPATION MEMBER

CROSS-REFERENCE TO RELATED APPLICATION

Korean Patent Application No. 10-2020-0067277, filed on Jun. 3, 2020, in the Korean Intellectual Property Office, and entitled: "Semiconductor Package," is incorporated by reference herein in its entirety.

BACKGROUND

1. Field

Embodiments relate to a semiconductor package.

2. Description of the Related Art

An integrated circuit chip may be realized in the form of a semiconductor package so as to be appropriately applied to an electronic product. In a typical semiconductor package, a semiconductor chip may be mounted on a printed circuit board (PCB) and may be electrically connected to the PCB through bonding wires or bumps. Various techniques for improving reliability and durability of semiconductor packages have been studied with the development of an electronic industry.

SUMMARY

In an aspect, a semiconductor package may include a first substrate, a first chip structure and a second chip structure spaced apart from each other on the first substrate, a gap region provided between the first and second chip structures, and a heat dissipation member covering the first chip structure, the second chip structure, and the first substrate. The heat dissipation member may include a first trench provided in an inner top surface of the heat dissipation member, and the first trench may vertically overlap with the gap region and may have a width greater than a width of the gap region. The first trench may vertically overlap with at least one of a portion of a top surface of the first chip structure or a portion of a top surface of the second chip structure.

In another aspect, a semiconductor package may include a package substrate, an interposer substrate disposed on the package substrate, a first chip structure and a second chip structure mounted on the interposer substrate and spaced apart from each other, a gap region provided between the first and second chip structures, and a heat dissipation member covering the first chip structure, the second chip structure, the interposer substrate and the package substrate and adhered to a top surface of the package substrate. The heat dissipation member may include a first trench provided in an inner top surface of the heat dissipation member, and the first trench may overlap with the gap region and may have a width greater than a width of the gap region. The first trench may vertically overlap with a portion of a top surface of the first chip structure and a portion of a top surface of the second chip structure. The heat dissipation member may have a first thickness at a portion spaced apart from the first trench, and a depth of the first trench may range from ⅓ to ⅔ of the first thickness.

In still another aspect, a semiconductor package may include a first substrate, a first chip structure and a second chip structure spaced apart from each other on the first substrate, a gap region provided between the first and second chip structures, and a heat dissipation member covering the first chip structure, the second chip structure, and the first substrate. The heat dissipation member may include a first trench overlapping with the gap region and having a width greater than a width of the gap region. The heat dissipation member may include three first outer corners and one second outer corner, and the second outer corner may have a different shape from that of the first outer corner.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
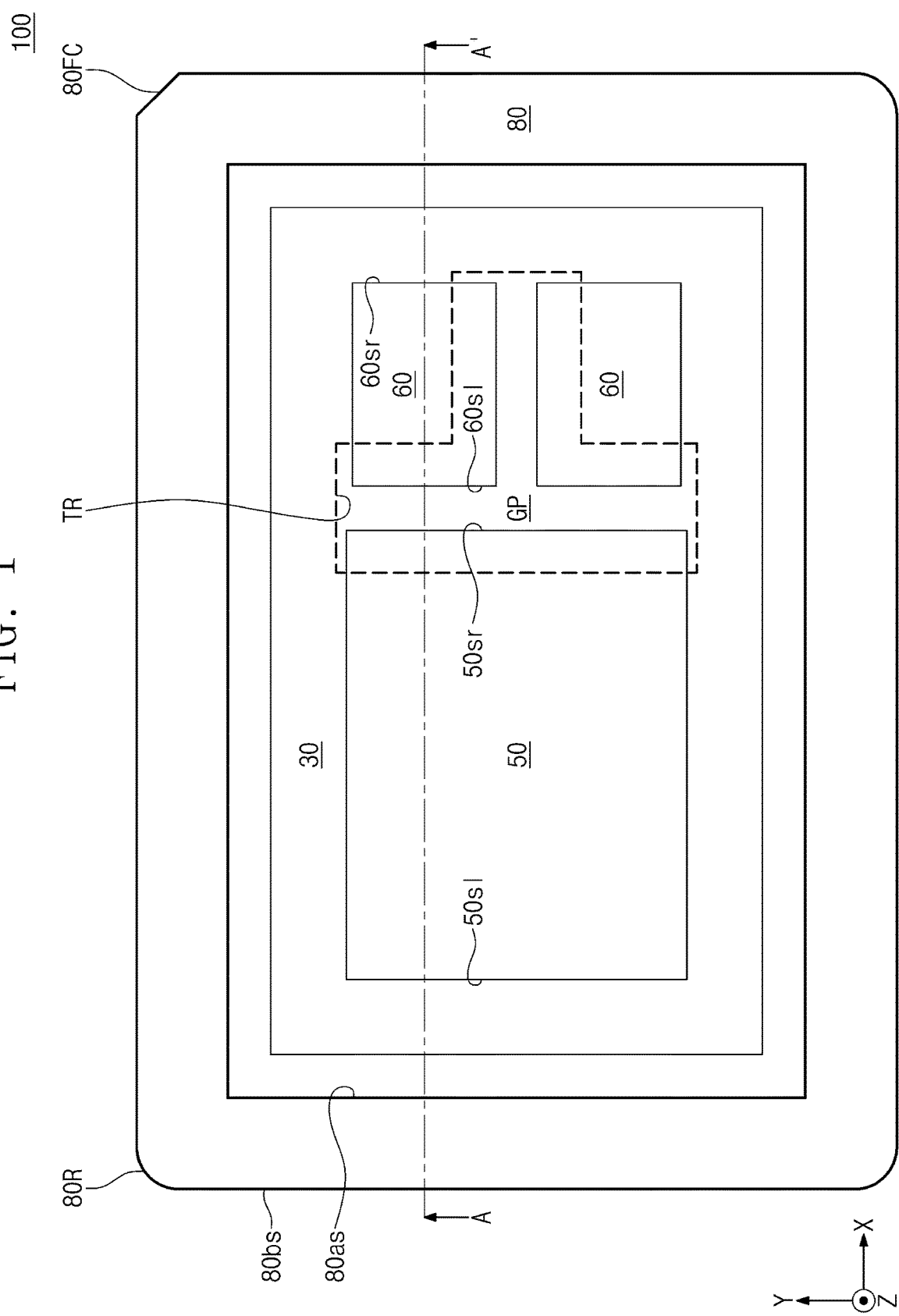
FIG. 1 is a plan view illustrating a semiconductor package according to some embodiments.
Figure 2:
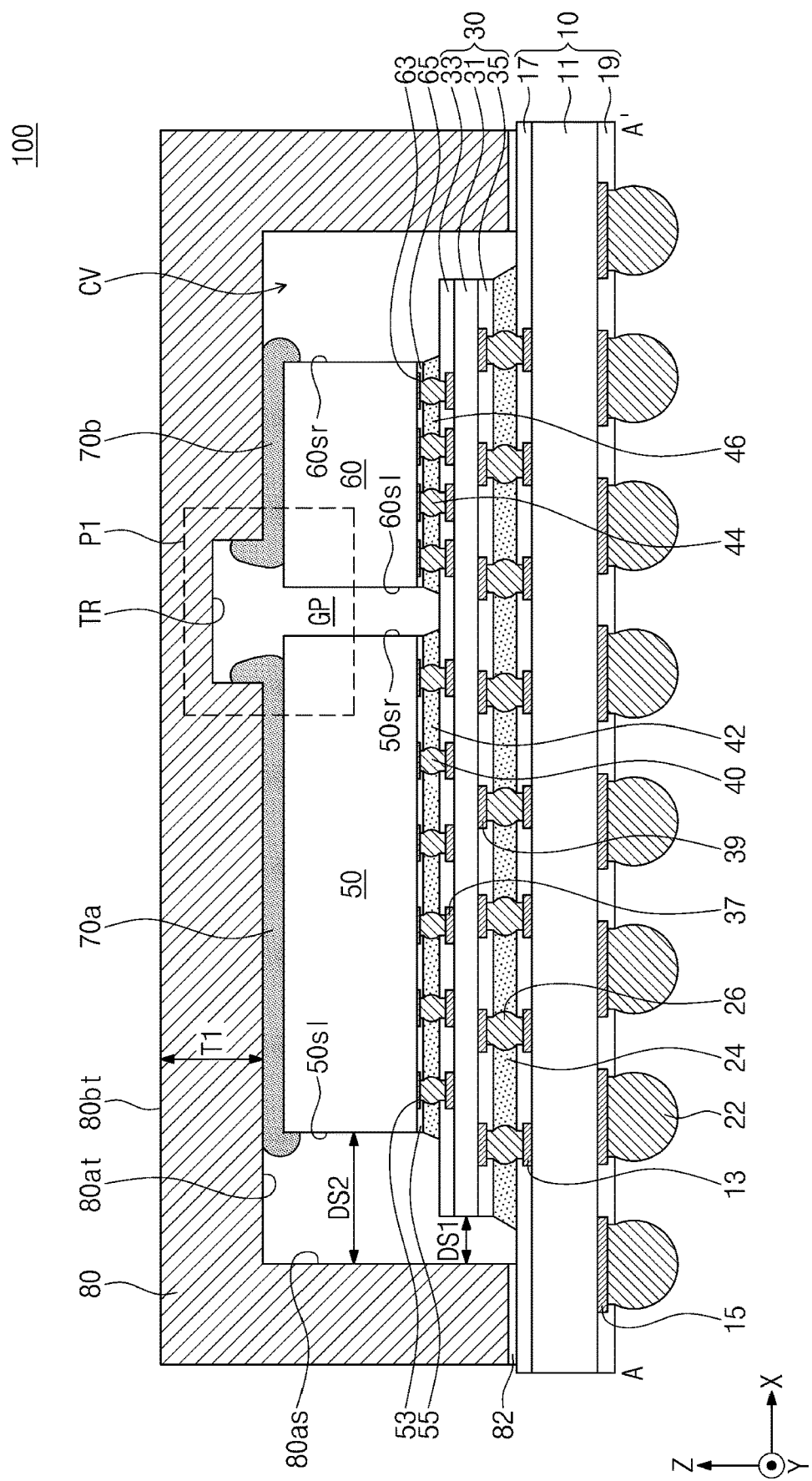
FIG. 2 is a cross-sectional view along line A-A' of FIG. 1 according to some embodiments.

FIG. 1 is a plan view illustrating a semiconductor package according to some embodiments. FIG. 2 is a cross-sectional view along line A-A' of FIG. 1, and FIGS. 3A to 3C are enlarged views of portion P1 of FIG. 2 according to some embodiments.

Referring to FIGS. 1 and 2, a semiconductor package 100 according to the present embodiments may include a first substrate 10. A second substrate 30 may be mounted on the first substrate 10. A first chip structure 50 and at least one second chip structure 60 may be mounted on the second substrate 30 and may be arranged in a first direction X, e.g., the first chip structure 50 and the at least one second chip structure 60 may be adjacent to each other along the first direction X (FIGS. 1 and 2). If more than one second chip structure 60 is provided, e.g., when two second chip structures 60 are provided, the second chip structures 60 may be arranged in a second direction Y, e.g., the two second chip structures 60 may be adjacent to each other along the second direction Y (FIG. 1).

As further illustrated in FIGS. 1 and 2, a heat dissipation member 80 may cover the first chip structure 50, the second chip structures 60, the second substrate 30, and the first substrate 10. An adhesive layer 82 may be interposed between a bottom surface of the heat dissipation member 80 and the first substrate 10. A first thermal interface material layer 70*a* may be interposed between the heat dissipation member 80 and the first chip structure 50, and a second thermal interface material layer 70*b* may be interposed between the heat dissipation member 80 and each of the second chip structures 60.

For example, the first substrate 10 may be a printed circuit board. The first substrate 10 may be referred to as a package substrate. The first substrate 10 may include a first core portion 11, first substrate upper conductive patterns 13 disposed on a top surface of the first core portion 11, a first substrate upper protective layer 17 covering the top surface of the first core portion 11, first substrate lower conductive patterns 15 disposed on a bottom surface of the first core portion 11, and a first substrate lower protective layer 19 covering the bottom surface of the first core portion 11. The first substrate upper conductive patterns 13 may be electrically connected to the first substrate lower conductive patterns 15. External connection terminals 22 may be bonded to the first substrate lower conductive patterns 15. The external connection terminals 22 may be solder balls. The external connection terminals 22 may include at least one of tin or lead.

The first core portion 11 may include at least one of, but not limited to, a thermosetting resin (e.g., epoxy resin), a thermoplastic resin (e.g., polyimide), a resin (e.g., prepreg) obtained by impregnating the thermosetting resin or the thermoplastic resin with a reinforcing material (e.g., a glass fiber and/or an inorganic filler), or a photocurable resin. The first substrate upper protective layer 17 and the first substrate lower protective layer 19 may be photosensitive solder resist (PSR) layers. The photosensitive solder resist (PSR) may include a photosensitive polymer. The photosensitive polymer may include at least one of, e.g., photosensitive polyimide (PSPI), polybenzoxazole (PBO), a phenolic polymer, or a benzocyclobutene-based polymer (BCB). The photosensitive solder resist (PSR) may further include an inorganic filler. The first substrate upper conductive patterns 13 and the first substrate lower conductive patterns 15 may include at least one of, e.g., copper, aluminum, or gold.

The second substrate 30 may be referred to as an interposer substrate. The second substrate 30 may include a second core portion 31, second substrate upper conductive patterns 37 disposed on a top surface of the second core portion 31, a second substrate upper protective layer 33 covering the top surface of the second core portion 31, second substrate lower conductive patterns 39 disposed on a bottom surface of the second core portion 31, and a second substrate lower protective layer 35 covering the bottom surface of the second core portion 31. For example, through-vias may be disposed in the second substrate 30.

The second core portion 31 may include, e.g., silicon. The second substrate upper protective layer 33 and the second substrate lower protective layer 35 may be photosensitive solder resist (PSR) layers. The photosensitive solder resist (PSR) may include a photosensitive polymer. The photosensitive polymer may include at least one of, e.g., photosensitive polyimide (PSPI), polybenzoxazole (PBO), a phenolic polymer, or a benzocyclobutene-based polymer (BCB). The photosensitive solder resist (PSR) may further include an inorganic filler. The second substrate upper conductive patterns 37 and the second substrate lower conductive patterns 39 may include at least one of, e.g., copper, aluminum, or gold.

The first substrate 10 and the second substrate 30 may be electrically connected to each other through first internal connection terminals 26. The first internal connection terminals 26 may electrically connect the first substrate upper conductive patterns 13 to the second substrate lower conductive patterns 39. Each of the first internal connection terminals 26 may include at least one of, e.g., a solder ball, a conductive bump, or a conductive pillar. The first internal connection terminals 26 may include at least one of, e.g., copper, tin, or lead. A first underfill layer 24 may be interposed between the first substrate 10 and the second substrate 30.

For example, the first chip structure 50 and/or the second chip structure 60 may be a single semiconductor chip or a single semiconductor die. The single semiconductor chip or the single semiconductor die may include a semiconductor substrate, and circuit structures including a plurality of transistors, a resistance element, a capacitor and an interconnection structure which are disposed on the semiconductor substrate. In another example, the first chip structure 50 and/or the second chip structure 60 may be a chip having a semiconductor package structure in which semiconductor chips/dies are stacked or arranged side by side. The first and second chip structures 50 and 60 may be referred to as semiconductor chips, semiconductor dies, or sub-semiconductor packages.

For example, the first chip structure 50 and the second chip structure 60 may each independently be a system large scale integration (LSI) chip, a logic circuit chip, an image sensor chip (e.g., a complementary metal oxide semiconductor (CMOS) or an imaging sensor (CIS)), a memory device chip (e.g., a flash memory chip, a dynamic random-access memory (DRAM) chip, a static random-access memory (SRAM) chip, an electrically erasable programmable read-only memory (EEPROM) chip, a phase change random-access memory (PRAM) chip, a magnetoresistive random-access memory (MRAM) chip, a resistive random-access memory (ReRAM) chip, a high bandwidth memory (HBM) chip, or a hybrid memory cubic (HMC) chip), a microelectromechanical system (MEMS) device chip, or an application-specific integrated circuit (ASIC) chip. In particular, the first chip structure 50 may be the ASIC chip, and the second chip structure 60 may be the HBM chip.

First chip conductive pads 53 and a first chip protective layer 55 may be disposed on a bottom surface of the first chip structure 50. The first chip conductive pads 53 may include a metal, e.g., aluminum or copper. The first chip protective layer 55 may be formed of, e.g., silicon nitride or polyimide. The first chip conductive pads 53 may be electrically connected to some of the second substrate upper conductive patterns 37 through second internal connection terminals 40. Each of the second internal connection terminals 40 may include at least one of, e.g., a solder ball, a conductive bump, or a conductive pillar. The second internal connection terminals 40 may include at least one of, e.g., copper, tin, or lead. A second underfill layer 42 may be interposed between the first chip structure 50 and the second substrate 30. The first chip structure 50 may include a first chip right sidewall 50*sr* adjacent to the second chip structure 60, and a first chip left sidewall 50*s*1 opposite to the first chip right sidewall 50*sr*.

Second chip conductive pads 63 and a second chip protective layer 65 may be disposed on a bottom surface of the second chip structure 60. The second chip conductive pads 63 may include a metal, e.g., aluminum or copper. The second chip protective layer 65 may be formed of silicon nitride or polyimide. The second chip conductive pads 63 may be electrically connected to others of the second substrate upper conductive patterns 37 through third internal connection terminals 44. Each of the third internal connection terminals 44 may include at least one of, e.g., a solder ball, a conductive bump, or a conductive pillar. The third internal connection terminals 44 may include at least one of, e.g., copper, tin, or lead. A third underfill layer 46 may be interposed between the second chip structure 60 and the second substrate 30. The second chip structure 60 may include a second chip left sidewall 60s1 adjacent to the first chip structure 50, and a second chip right sidewall 60sr opposite to the second chip left sidewall 60s1.

The first to third underfill layers 24, 42 and 46 may include a thermosetting resin or a photocurable resin. In addition, the first to third underfill layers 24, 42 and 46 may further include an organic filler or an inorganic filler. The second underfill layer 42 may be spaced apart from the third underfill layer 46, e.g., along the first direction X.

The heat dissipation member 80 may include a material having excellent thermal conductivity, e.g., a metal. The heat dissipation member 80 may include a cavity CV defined by an inner top surface 80at and an inner sidewall 80as of the heat dissipation member 80, and the first and second chip structures 50 and 60 and the second substrate 30 may be inserted in the cavity CV, e.g., the heat dissipation member 80 may have a H-shaped cross-section on the first substrate 10 to define the cavity CV between the first substrate 10 and the H-shaped cross-section. Each of the first and second thermal interface material layers 70a and 70b may include a thermosetting resin layer. Each of the first and second thermal interface material layers 70a and 70b may further include filler particles dispersed in the thermosetting resin layer. The filler particles may include at least one of, e.g., silica, alumina, zinc oxide, or nitrogen boride. The adhesive layer 82 may include the same material as the first and second thermal interface material layers 70a and 70b.

Referring to FIG. 2, the second substrate 30 may be spaced apart from the inner sidewall 80as of the heat dissipation member 80 by a first distance DS1, e.g., along the first and/or second directions X and Y. The first chip structure 50 may be spaced apart from the inner sidewall 80as of the heat dissipation member 80 by a second distance DS2, e.g., along the first and/or second directions X and Y. The second chip structure 60 may also be spaced apart from the inner sidewall 80as of the heat dissipation member 80 by the second distance DS2. The second distance DS2 may be greater than the first distance DS1. For example, the first distance DS1 may be 600 μm or more, e.g., the first distance DS1 may range from about 700 μm to about 1400 μm. For example, the second distance DS2 may be 1000 μm or more, e.g., the second distance DS2 may range from about 2000 μm to about 3000 μm.

Referring to FIGS. 1 to 3A, the first chip structure 50 and the second chip structures 60 may be spaced apart from each other, and thus a gap region GP may be formed therebetween. The first chip right sidewall 50sr and the second chip left sidewall 60s1 may be exposed by the gap region GP. The first chip right sidewall 50sr may be spaced apart from the second chip left sidewall 60s1 by a third distance DS3, e.g., along the first direction X (FIG. 3A), and the third distance DS3 may correspond to a width of the gap region GP. A distance between the second chip structures 60, e.g., along the second direction Y, may be equal to the third distance DS3 or may range from about 0.8 times to about 1.2 times the third distance DS3. For example, the third distance DS3 may range from about 500 μm to about 700 μm.

Referring to FIG. 1, the heat dissipation member 80 may have four outer sidewalls 80bs arranged in a clockwise direction, and outer corners 80R and 80FC at which the outer sidewalls 80bs meet each other. The outer corners 80R and 80FC may include three first outer corners 80R and one second outer corner 80FC. The second outer corner 80FC may have a different shape from that of the first outer corner 80R, and thus, may be used as a reference of a direction/a position. For example, the first outer corners 80R may have round, e.g., curved, shapes when viewed in a plan view. The second outer corner 80FC may have a faceted, e.g., linear, shape having a facet when viewed in a plan view, e.g., the second outer corner 80FC may have a flat surface slanted at an oblique angle with respect to each of the adjoining outer sidewalls 80bs of the heat dissipation member 80. The second outer corner 80FC may represent a mounting direction of the heat dissipation member 80 or the semiconductor package 100.

As further illustrated in FIGS. 1 and 2, a trench TR overlapping the gap region GP e.g., in a vertical direction, may be provided in the inner top surface 80at of the heat dissipation member 80. A planar shape of the trench TR may be changed depending on a planar shape of the gap region GP. In the present embodiments, as illustrated in FIG. 1, the trench TR may have a T-shape when viewed in a plan view, e.g., to overlap the shape of the gap region GP between the first and second chip structures 50 and 60. The trench TR may be formed to be recessed from the inner top surface 80at toward an outer top surface 80bt of the heat dissipation member 80, as illustrated in FIG. 2.

Figure 3A:
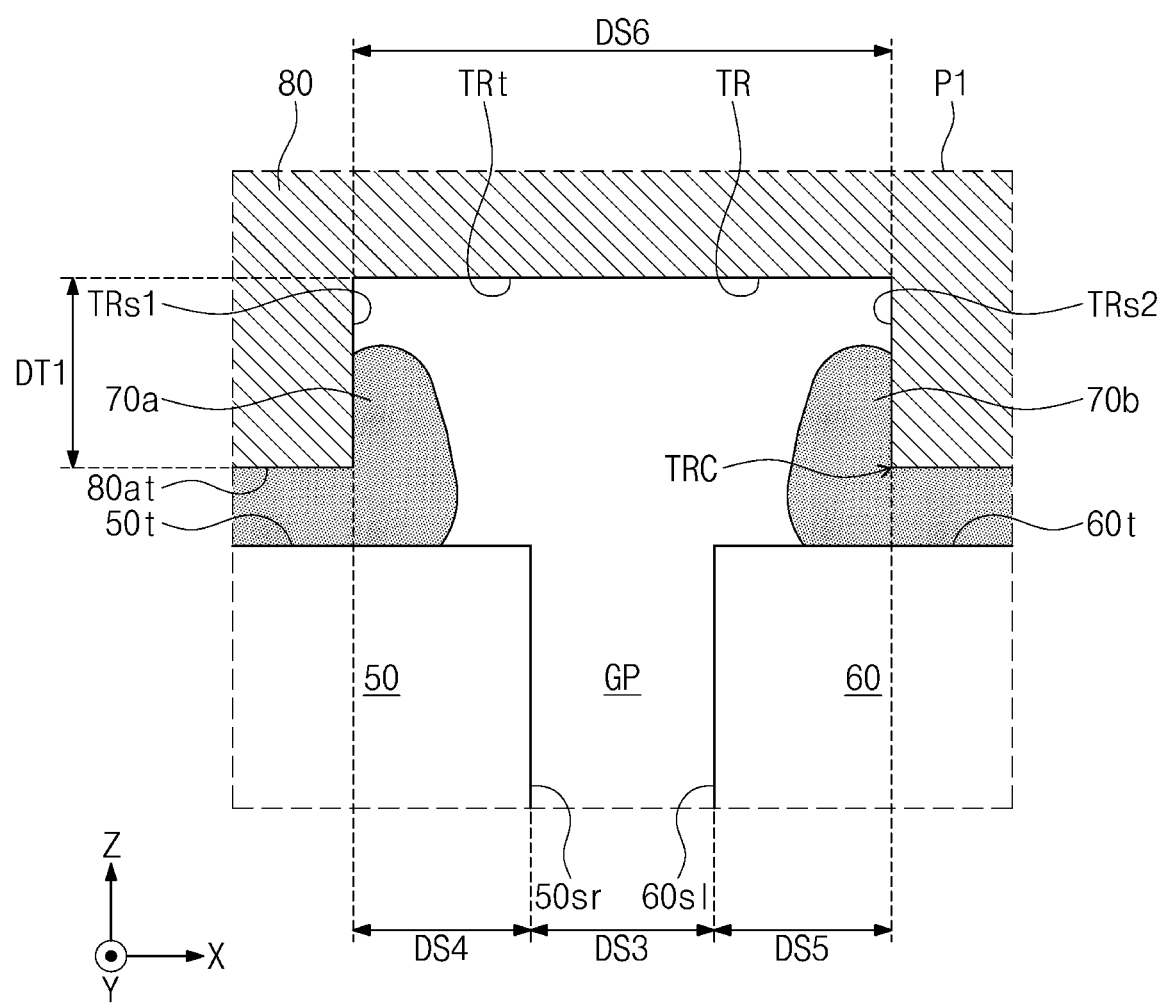
FIGS. 3A to 3C are enlarged views of portion P1 of FIG. 2 according to some embodiments.

Referring to FIG. 3A, at least one of a portion of a first chip top surface 50t of the first chip structure 50 or a portion of a second chip top surface 60t of the second chip structure 60 may vertically overlap with the trench TR. The trench TR may have a trench top surface TRt, and a first trench sidewall TRs1 and a second trench sidewall TRs2 which are opposite to each other, e.g., the first and second trench sidewalls TRs1 and TRs2 may be spaced apart from each other along the first direction X. The first trench sidewall TRs1 may be adjacent to the first chip right sidewall 50sr, while being spaced apart from the first chip right sidewall 50sr by a fourth distance DS4, e.g., along the first direction X. Thus, at least a portion of the first chip top surface 50t of the first chip structure 50 may be exposed. The fourth distance DS4 may correspond to a width, in the first direction X, of the portion of the first chip top surface 50t overlapping with the trench TR. The fourth distance DS4 may range from about 0.8 times to about 1.2 times the third distance DS3.

The second trench sidewall TRs2 may be adjacent to the second chip left sidewall 60s1, while being spaced apart from the second chip left sidewall 60s1 by a fifth distance DS5. Thus, at least a portion of the second chip top surface 60t of the second chip structure 60 may be exposed. The fifth distance DS5 may correspond to a width, in the first direction X, of the portion of the second chip top surface 60t overlapping with the trench TR. The fifth distance DS5 may range from about 0.8 times to about 1.2 times the third distance DS3.

A sixth distance DS6 between the first and second trench sidewalls TRs1 and TRs2, which corresponds to a width of the trench TR, may be greater than the third distance DS3. The sixth distance DS6 may correspond to a sum of the third to fifth distances DS3, DS4 and DS5. A portion of the first chip top surface 50t and a portion of the second chip top surface 60t may overlap with the trench TR.

The heat dissipation member 80 may have a first thickness T1 from the inner top surface 80at to the outer top surface 80bt, as illustrated in FIG. 2. To substantially minimize or prevent a warpage phenomenon of the semiconductor package 100, the first thickness T1 may range from about 700 μm to about 2000 μm. If the first thickness T1 is less than 700 μm, the warpage phenomenon of the semiconductor package 100 may be increased. If the first thickness T1 is greater than 2000 μm, high integration of the semiconductor package 100 may be difficult.

A distance from the inner top surface 80at of the heat dissipation member 80 to the trench top surface TRt (i.e., a depth DT1 of the trench TR) may be less than the first thickness T1, e.g., along the direction Z. When the thermal interface material layers 70a and 70b respectively located on the first and second chip structures 50 and 60 are pressed by the heat dissipation member 80 in a process of manufacturing the semiconductor package 100, the specific structure of the heat dissipation member 80 may prevent the thermal interface material layers 70a and 70b protruding laterally from the trench sidewalls TRs1 and TRs2 by the pressing of the heat dissipation member 80 from entering the gap region GP. For example, referring to FIG. 2, due to the depth of the trench TR and the exposed portions of the upper surfaces of the first and second chip structures 50 and 60, when the thermal interface material layers 70a and 70b are pressed by the heat dissipation member 80 against the first and second chip structures 50 and 60, the thermal interface material layers 70a and 70b may extend along the exposed portions of the upper surfaces of the first and second chip structures 50 and 60, and along the sidewalls of the trench TR into the trench TR (rather than beyond the first and second chip structures 50 and 60 into the gap region GP). In other words, at this time, the thermal interface material layers 70a and 70b may first enter the trench TR before entering the gap region GP. If the depth DT1 of the trench TR is too small, the thermal interface material layers 70a and 70b may not sufficiently enter the trench TR and may enter the gap region GP.

In some embodiments, the depth DT1 of the trench TR may be equal to or greater than a greater of the fourth distance DS4 and the fifth distance DS5. Thus, the first thermal interface material layer 70a coming out (or protruding) onto the first chip top surface 50t overlapping with the trench TR may sufficiently enter the trench TR. The first thermal interface material layer 70a may be in contact with the first trench sidewall TRs1. In addition, the second thermal interface material layer 70b coming out (or protruding) onto the second chip top surface 60t overlapping with the trench TR may sufficiently enter the trench TR. The second thermal interface material layer 70b may be in contact with the second trench sidewall TRs2.

In some embodiments, the depth DT1 of the trench TR may be less than ⅔ of the first thickness T1. If the depth DT1 of the trench TR is greater than ⅔ of the first thickness T1, a portion of the heat dissipation member 80 on the trench TR may be too thin, and thus a warpage characteristic of the semiconductor package 100 may be deteriorated. In some embodiments, the third to fifth distances DS3, DS4 and DS5 may be equal to each other. The depth DT1 of the trench TR may range from about 1 time to about 1.3 times the fourth distance DS4 or the fifth distance DS5. The depth DT1 of the trench TR may range from about ⅓ to about ⅔ of the first thickness T1. Each of the third to fifth distances DS3, DS4 and DS5 may be, e.g., about 600 μm. The depth DT1 of the trench TR may be, e.g., about 700 μm. The first thickness T1 may be, e.g., about 1500 μm.

If the first trench sidewall TRs1 were to be aligned with the first chip right sidewall 50sr or were to overlap with the gap region GP, the first thermal interface material layer 70a would have had a greater probability of entering the gap region GP due to gravity, rather than entering the trench TR. In addition, if the second trench sidewall TRs2 were to be aligned with the second chip left sidewall 60s1 or were to overlap with the gap region GP, the second thermal interface material layer 70b would have had a greater probability of entering the gap region GP due to gravity, rather than entering the trench TR. If the width DS6 of the trench TR were to equal to or be less than the width DS3 of the gap region GP, the thermal interface material layers 70a and 70b would have had greater probabilities of entering the gap region GP due to gravity, rather than entering the trench TR. In these cases, reliability of the semiconductor package would have deteriorated.

A top end of the first chip left sidewall 50s1 of the first chip structure 50 may be in contact with the first thermal interface material layer 70a. A top end of the second chip right sidewall 60sr of the second chip structure 60 may be in contact with the second thermal interface material layer 70b.

Figure 3B:
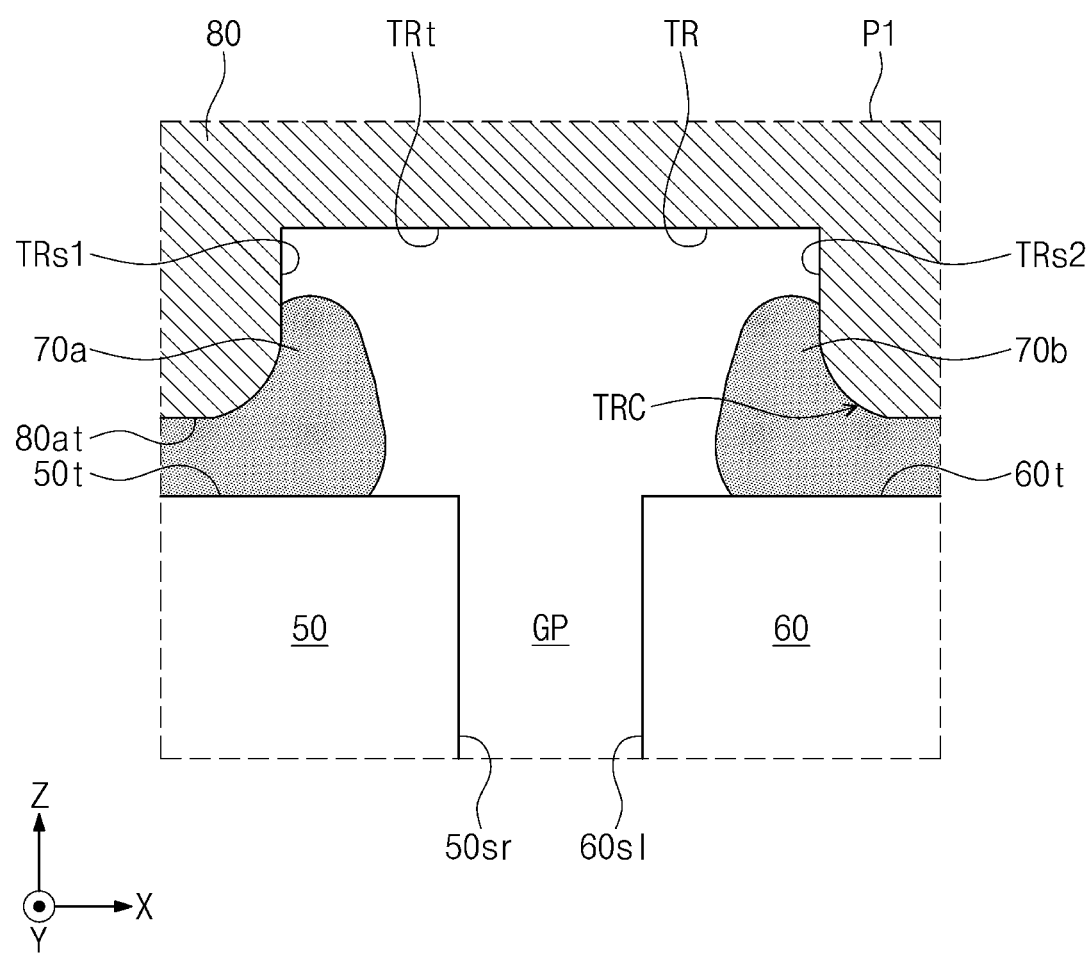
Figure 3C:
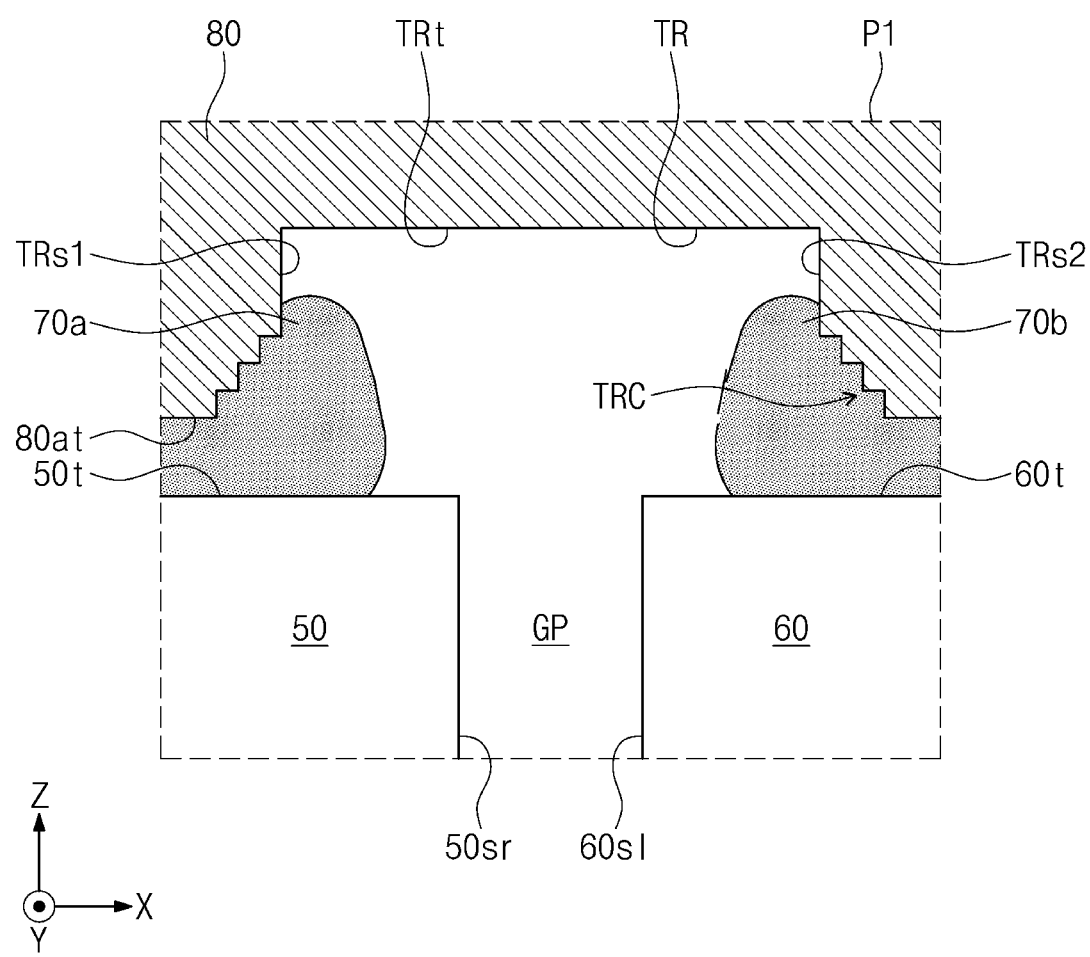

Referring to FIGS. 3A to 3C, the first trench sidewall TRs1 or the second trench sidewall TRs2 may meet the inner top surface 80at of the heat dissipation member 80 at an entrance portion TRC. For example, a cross section of the entrance portion TRC may be angled at about 90 degrees, as illustrated in FIG. 3A. In another example, the cross section of the entrance portion TRC may be rounded, as illustrated in FIG. 3B. In yet another example, the cross section of the entrance portion TRC may have a stepped shape, as illustrated in FIG. 3C. The structure of the entrance portion TRC in FIG. 3B or 3C may be easier to implement. The first and second thermal interface material layers 70a and 70b may be spaced apart from the trench top surface TRt.

Figure 4A:
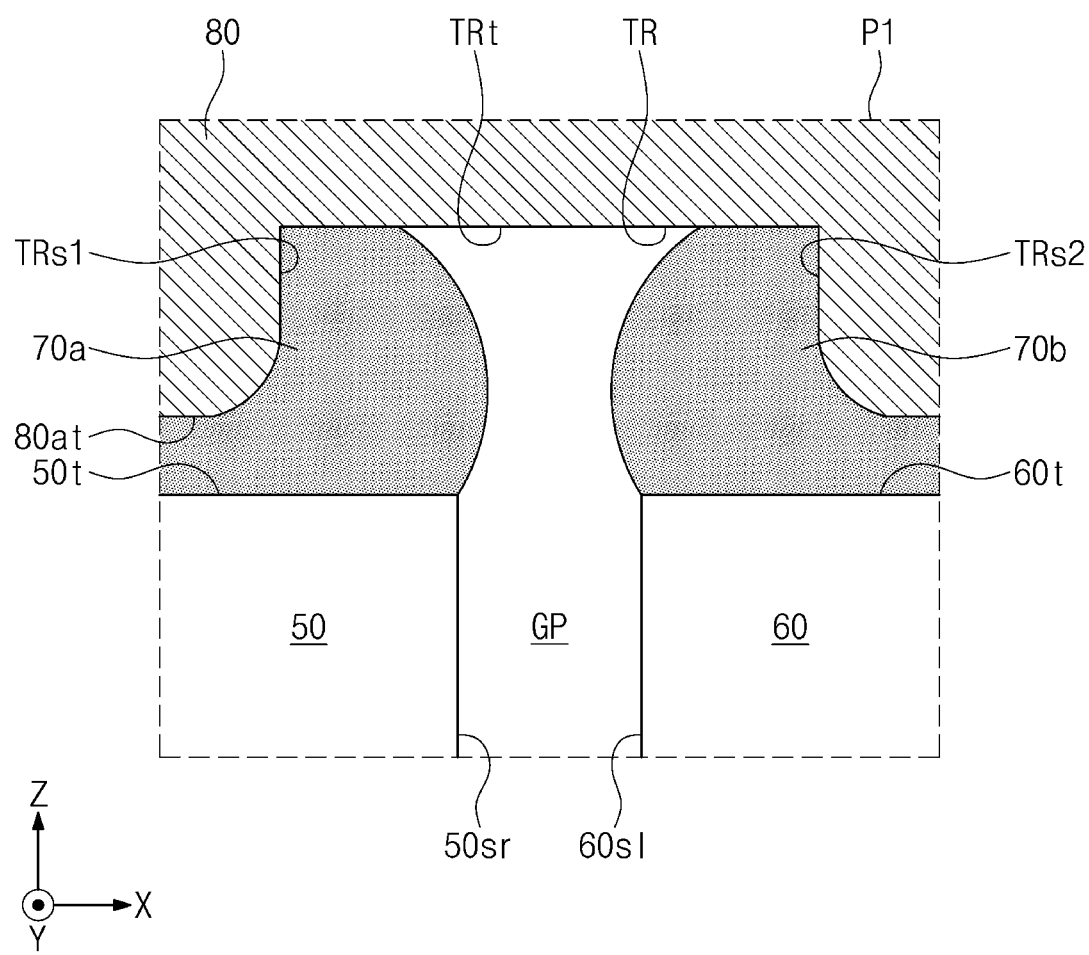
FIGS. 4A to 4C are enlarged views of portion P1 of FIG. 2 according to some embodiments.
Figure 4B:
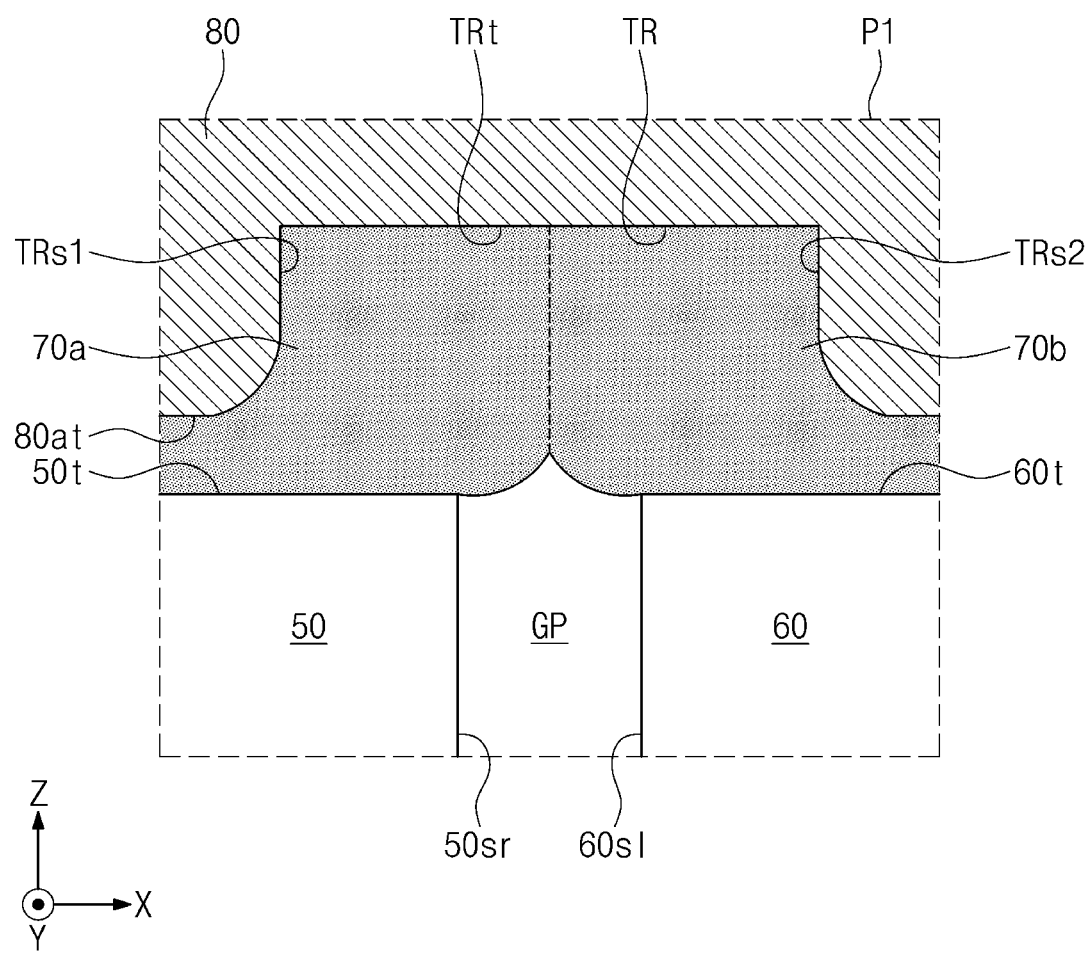
Figure 4C:
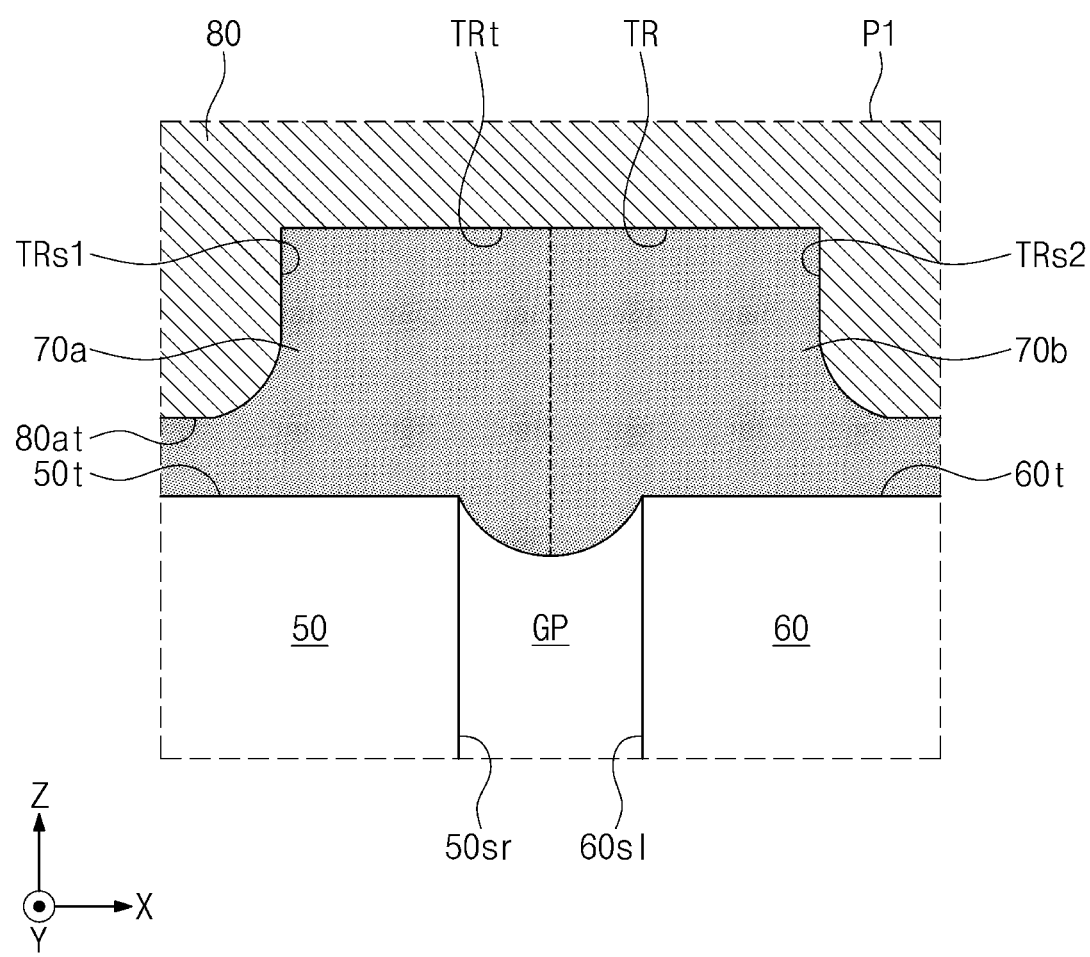

FIGS. 4A to 4C are enlarged views of the P1 of FIG. 2 according to some other embodiments.

In some embodiments, at least one of the first and second thermal interface material layers 70a and 70b may be in contact with the trench top surface TRt, as illustrated in FIG. 4A. In certain embodiments, the first and second thermal interface material layers 70a and 70b may be in contact with each other and may fill the trench TR, as illustrated in FIG. 4B. In addition, a portion of the first and second thermal interface material layers 70a and 70b may be, e.g., partially, inserted in the gap region GP, as illustrated in FIG. 4C.

Figure 5:
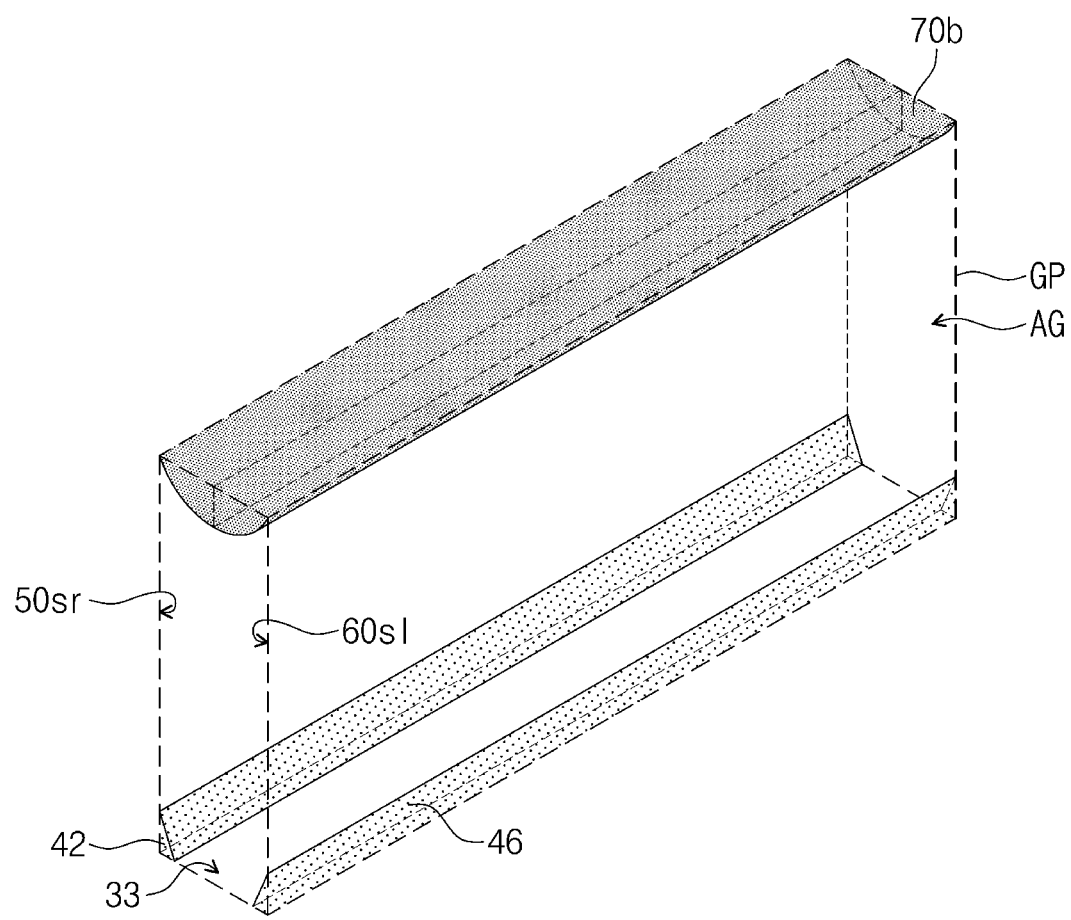
FIG. 5 is a perspective view illustrating a structure between a first chip structure and a second chip structure, according to some embodiments.

FIG. 5 is a perspective view illustrating a structure between the first chip structure 50 and the second chip structure 60, according to some embodiments.

Referring to FIGS. 2, 4C, and 5, the gap region GP may be provided between the first chip right sidewall 50sr of the first chip structure 50 and the second chip left sidewall 60s1 of the second chip structure 60. A top end of the gap region GP may be defined by a height of the top surface 50t of the first chip structure 50 or the top surface 60t of the second chip structure 60. A bottom end of the gap region GP may be defined by the top surface of the second substrate 30 (i.e., the top surface of the second substrate upper protective layer 33). One side of the gap region GP may be defined by the first chip right sidewall 50sr of the first chip structure 50. Another side of the gap region GP may be defined by the second chip left sidewall 60s1 of the second chip structure 60.

An empty space AG not occupied by the first and second thermal interface material layers 70a and 70b and the second and third underfill layers 42 and 46 may exist in the gap region GP. The first and second thermal interface material layers 70a and 70b may have different physical properties (e.g., a coefficient of thermal expansion and an elastic modulus) from those of the second and third underfill layers 42 and 46. A temperature may be changed from a room temperature to about 200 degrees Celsius in processes of manufacturing the semiconductor package 100. If the thermal interface material layers 70a and 70b are in contact with at least one of the second and third underfill layers 42 and 46 in the gap region GP, stress may occur by a difference in physical properties therebetween, and thus a crack may occur at least in one of the second and third underfill layers 42 and 46. For example, a crack may occur at an interface between the second substrate 30 and at least one of the second and third underfill layers 42 and 46. If this crack occurs, a degree of the crack may be increased by a rapid temperature change in a subsequent process of testing a semiconductor package, and thus at least one or some of the second internal connection terminals 40 and the third internal connection terminals 44 may be separated from the second substrate upper conductive patterns 37 to cause a bump open phenomenon. Thus, to prevent this, a volume occupied by the thermal interface material layers 70a and 70b in the gap region GP may be equal to or less than 10% of a volume of the gap region GP.

According to the embodiments, the specific structure of the trench TR formed in the heat dissipation member 80 may inhibit/prevent the thermal interface material layers 70a and 70b from entering the gap region GP. Thus, the reliability of the semiconductor package 100 may be improved.

Figure 6:
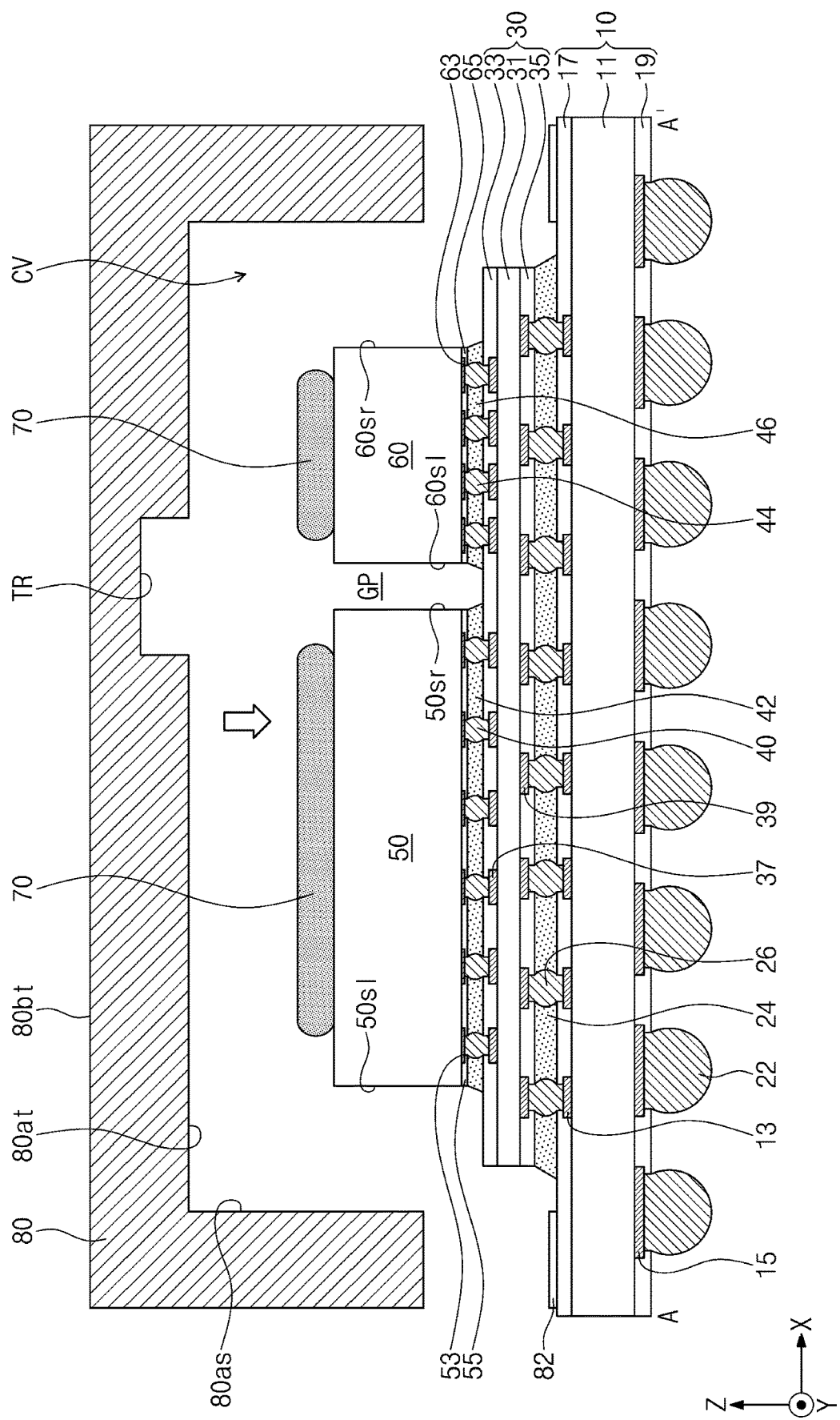
FIG. 6 is a cross-sectional view illustrating a process of manufacturing a semiconductor package having the cross section of FIG. 2.

FIG. 6 is a cross-sectional view illustrating a process of manufacturing a semiconductor package having the cross section of FIG. 2.

Referring to FIG. 6, the first substrate 10 may be prepared. The second substrate 30 may be bonded onto the first substrate 10 with the first internal connection terminals 26 interposed therebetween. The first underfill layer 24 may be formed between the first substrate 10 and the second substrate 30. A thermosetting or photocurable resin solution may be injected between the first substrate 10 and the second substrate 30, and then, the resin solution may be hardened to form the first underfill layer 24. The first chip structure 50 may be mounted on the second substrate 30 with second internal connection terminals 40 interposed therebetween. The second underfill layer 42 may be formed between the first chip structure 50 and the second substrate 30. A thermosetting or photocurable resin solution may be injected between the second substrate 30 and the first chip structure 50, and then, the resin solution may be hardened to form the second underfill layer 42. The second chip structure 60 may be mounted on the second substrate 30 with third internal connection terminals 44 interposed therebetween. The third underfill layer 46 may be formed between the second chip structure 60 and the second substrate 30.

The heat dissipation member 80 including the cavity CV may be prepared. The trench TR may be formed in the cavity CV of the heat dissipation member 80. The trench TR may be formed using, e.g., a laser drilling process, a milling process, a punching process, or a chemical etching process. A resin solution 70 for forming a thermal interface material layer may be coated on each of top surfaces 50t and 60t of the first and second chip structures 50 and 60, and then may be covered by the heat dissipation member 80 having the trench TR. Thereafter, the heat dissipation member 80 may be pressed by, e.g., a jig. At this time, the heat dissipation member 80 may be located in such a way that the trench TR overlaps the gap region GP between the chip structures 50 and 60, e.g., centers of the trench TR and the gap region GP may be aligned. Heat of about 200 degrees Celsius may be applied in this state to harden the resin solution, and thus the first and second thermal interface material layers 70a and 70b of FIG. 2 may be formed.

Referring to FIGS. 2, 3A and 6, the resin solution 70 may be pushed out toward trench sidewalls TRs1 and TRs2 of the trench TR by the pressing of the heat dissipation member 80. The heat dissipation member 80 may have the trench TR having the aforementioned structure and position, and thus the gap region GP may be spaced apart from the trench sidewalls TRs1 and TRs2 by the fourth distance DS4 and the fifth distance DS5. As a result, the resin solution 70 pushed out may first enter the trench TR before entering the gap region GP. Thus, the first and second thermal interface material layers 70a and 70b may be formed like FIGS. 2 and 3A. Therefore, the above crack phenomenon may be prevented, thereby improving the reliability and yield of the semiconductor package 100. The adhesive layer 82 may be formed simultaneously with the thermal interface material layers 70a and 70b. Depending on the amount of the resin solution and the weight of the jig, shapes of the first and second thermal interface material layers 70a and 70b in the trench TR may be changed as described with reference to FIGS. 3A to 4C.

Figure 7:
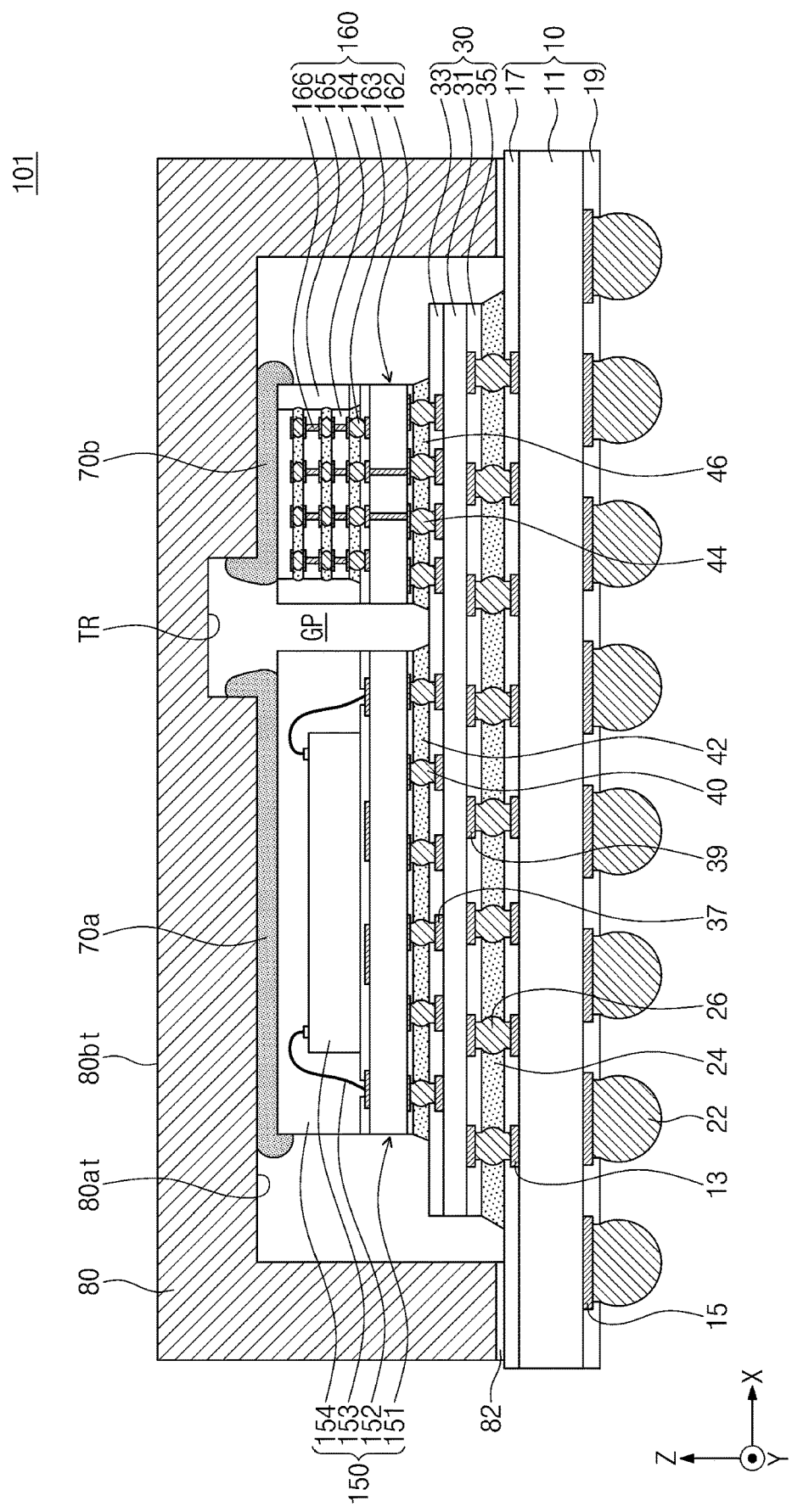
FIG. 7 is a cross-sectional view illustrating a semiconductor package according to some embodiments.

FIG. 7 is a cross-sectional view illustrating a semiconductor package according to some embodiments.

Referring to FIG. 7, in a semiconductor package 101 according to the present embodiments, the first chip structure may be a first sub-semiconductor package 150 and the second chip structure may be a second sub-semiconductor package 160. The first sub-semiconductor package 150 may include a first sub-package substrate 151, a first sub-semiconductor chip 153 connected to the first sub-package substrate 151 through a wire 152, and a first sub-mold layer 154 covering the first sub-semiconductor chip 153.

The second sub-semiconductor package 160 may include a second sub-semiconductor chip 162 and a plurality of third sub-semiconductor chips 164 sequentially stacked on the second sub-semiconductor chip 162. For example, the second sub-semiconductor chip 162 may be a logic die, and the third sub-semiconductor chip 164 may be a memory die (e.g., a DRAM die). The second sub-semiconductor chip 162 and the third sub-semiconductor chips 164 may include through-electrodes 166 therein. The third sub-semiconductor chips 164 may be stacked by a flip chip bonding method. A second sub-mold layer 165 may cover sidewalls of the third sub-semiconductor chips 164 and a top surface of the second sub-semiconductor chip 162.

For example, the first and second sub-mold layers 154 and 165 may include an insulating resin, e.g., an epoxy molding compound (EMC). The first and second sub-mold layers 154 and 165 may further include fillers, and the fillers may be dispersed in the insulating resin. The fillers may include, e.g., silicon oxide ($SiO_2$).

A top surface of an uppermost one of the third sub-semiconductor chips 164 may be coplanar with a top surface of the second sub-mold layer 165. A second thermal interface material layer 70b may be in direct contact with the uppermost third sub-semiconductor chip 164. Thus, heat generated from the third sub-semiconductor chips 164 may be rapidly dissipated or released to the outside through the second thermal interface material layer 70b. Other components may be the same/similar as described with reference to FIGS. 1 to 5.

Figure 8:
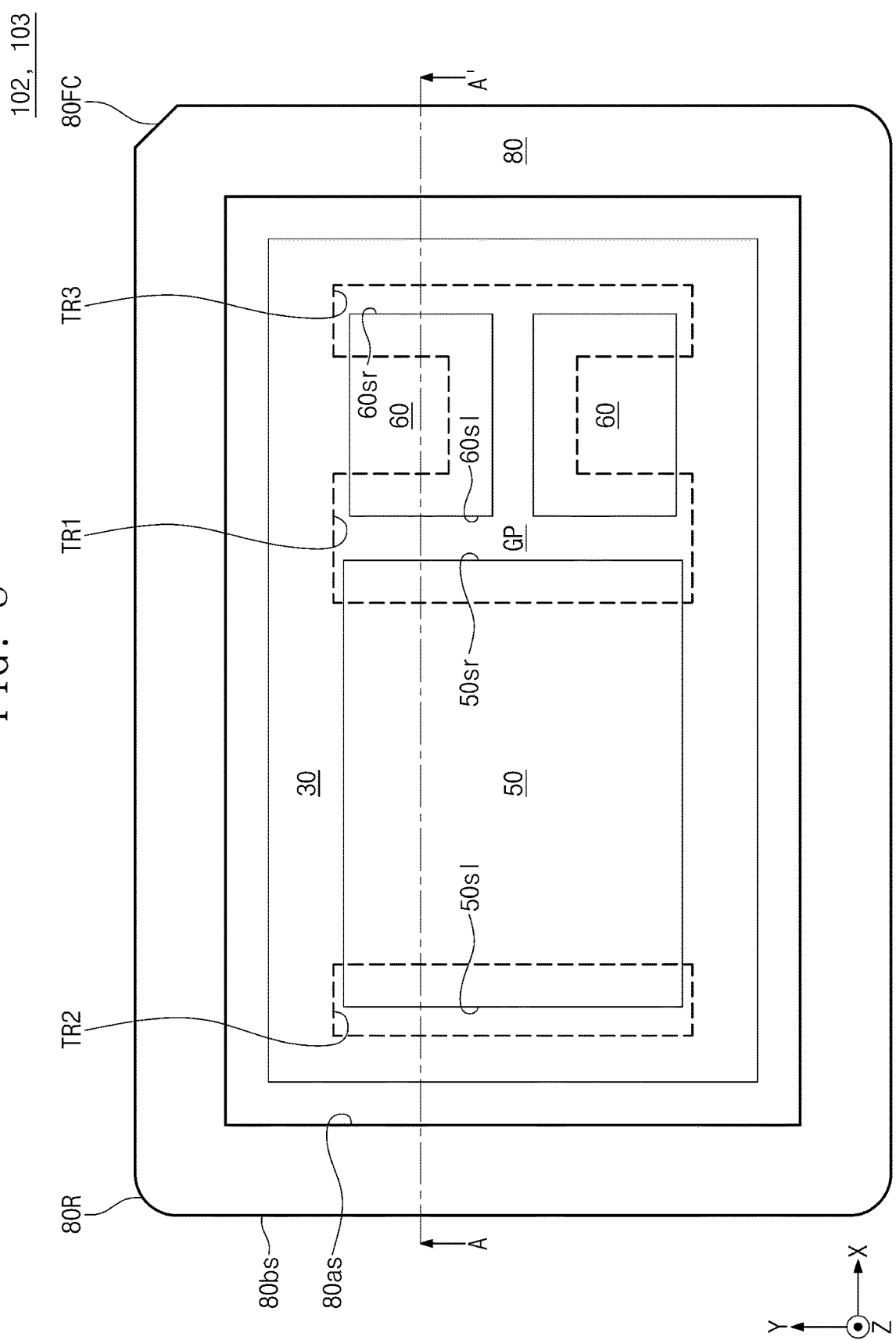
FIG. 8 is a plan view illustrating a semiconductor package according to some embodiments.
Figure 9:
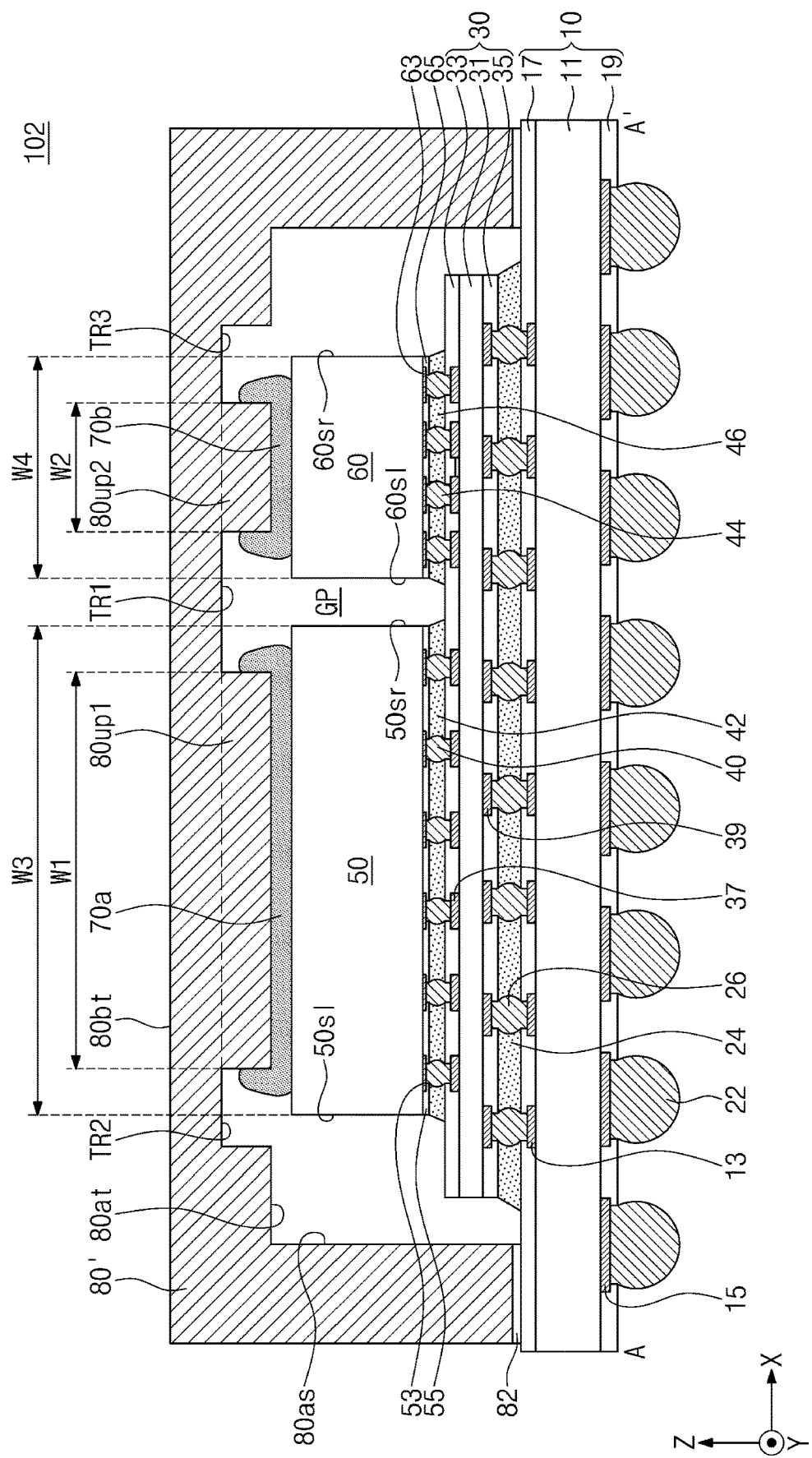
FIG. 9 is a cross-sectional view along line A-A' of FIG. 8 according to some embodiments.

FIG. 8 is a plan view illustrating a semiconductor package according to some embodiments. FIG. 9 is a cross-sectional view along line A-A' of FIG. 8.

Referring to FIGS. 8 and 9, in a semiconductor package 102 according to the present embodiments, a heat dissipation member 80' may include a first trench TR1, a second trench TR2, and a third trench TR3. The first trench TR1 may be the same as the trench TR described with reference to FIGS. 1 to 7 and may overlap with the gap region GP between the first chip structure 50 and the second chip structures 60. The second trench TR2 may overlap with the first chip left sidewall 50s1 of the first chip structure 50. The third trench TR3 may overlap with the second chip right sidewall 60sr of the second chip structure 60. The first trench TR1 may have the same shape as the trench TR of FIG. 1. The second trench TR2 may have a bar shape extending in the second direction Y. The third trench TR3 may be connected to the first trench TR1.

In FIG. 9, a portion of the heat dissipation member 80' between the first trench TR1 and the second trench TR2 may be referred to as a first heat dissipation inner protrusion 80up1. In addition, a portion of the heat dissipation member 80' between the first trench TR1 and the third trench TR3 may be referred to as a second heat dissipation inner protrusion 80up2. The first heat dissipation inner protrusion 80up1 may have a first width W1 in the first direction X. The second heat dissipation inner protrusion 80up2 may have a second width W2 in the first direction X. The first chip structure 50 may have a third width W3 in the first direction X. The second chip structure 60 may have a fourth width W4 in the first direction X.

The first width W1 may be less than the third width W3. A depth and a width of the second trench TR2 and an overlapping degree of the second trench TR2 with the first chip top surface 50t of the first chip structure 50 may be the same/similar as those of the trench TR described with reference to FIGS. 2 to 5. Thus, a portion of the first thermal interface material layer 70a may be inserted into the second trench TR2. In addition, the second width W2 may be less than the fourth width W4. A depth and a width of the third trench TR3 and an overlapping degree of the third trench TR3 with the second chip top surface 60t of the second chip structure 60 may be the same/similar as those of the trench TR described with reference to FIGS. 2 to 5. Thus, a portion of the second thermal interface material layer 70b may be inserted into the third trench TR3.

Figure 10:
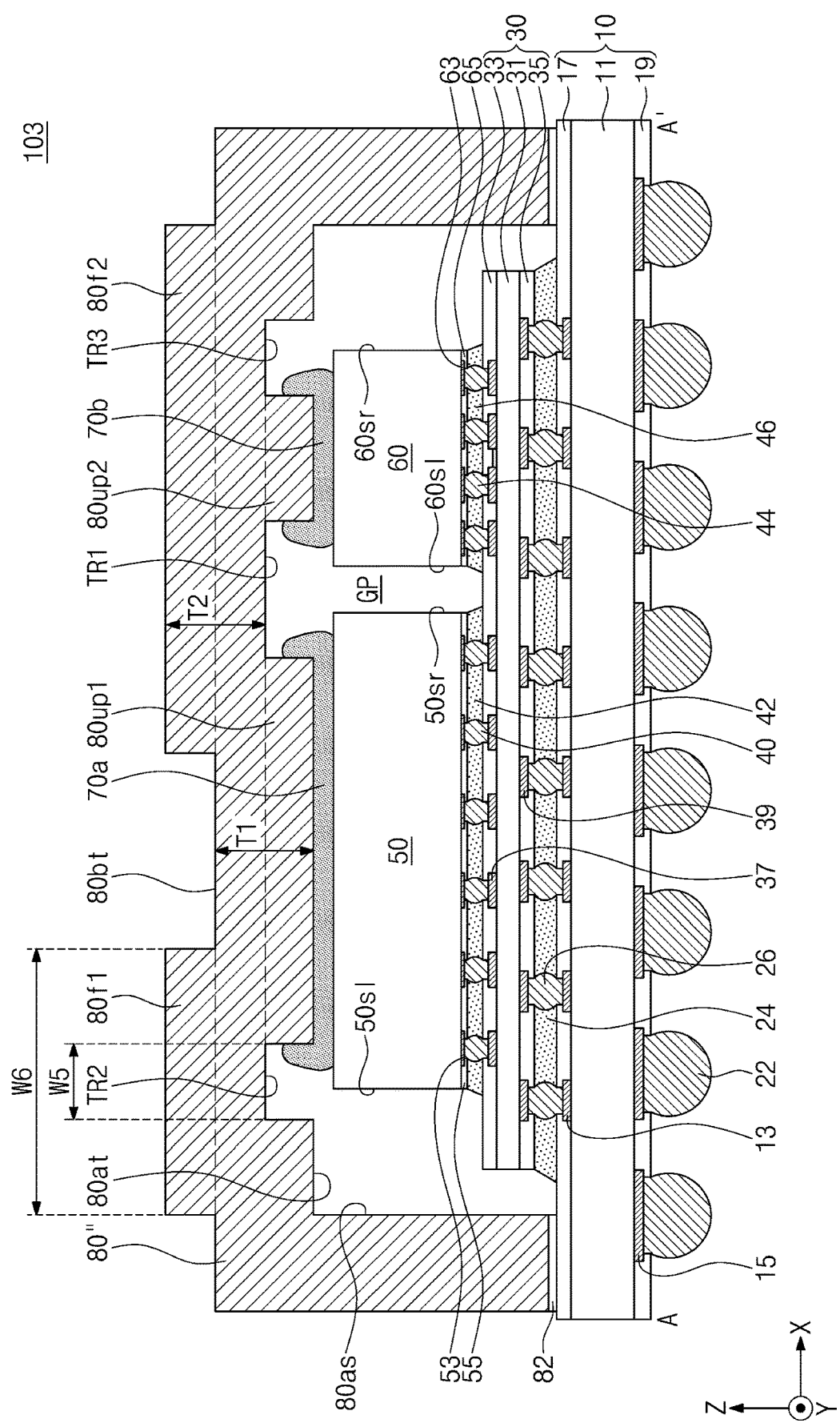
FIG. 10 is a cross-sectional view along line A-A' of FIG. 8 according to some embodiments.

FIG. 10 is a cross-sectional view along line A-A' of FIG. 8 according to other embodiments.

Referring to FIG. 10, in a semiconductor package 103 according to the present embodiments, a heat dissipation member 80" may have the structure of FIG. 9 and may further include a first fin portion 80f1 and a second fin portion 80f2 which protrude upward from the outer top surface 80bt. The first fin portion 80f1 may overlap with the second trench TR2. The second trench TR2 may have a fifth width W5 in the first direction X. The first fin portion 80f1 may have a sixth width W6 in the first direction X. The sixth width W6 may be greater than the fifth width W5. The second fin portion 80f2 may overlap with both the first trench TR1 and the third trench TR3. When viewed as a whole, it may be expressed that the outer top surface 80bt has an uneven shape. The heat dissipation member 80" may have a first thickness T1 at a place spaced apart from the first trench TR1 and may have a second thickness T2 on the first trench TR1. The second thickness T2 may be equal to the first thickness T1. Thus, a warpage phenomenon of the semiconductor package 103 may be minimized/prevented to improve reliability of the semiconductor package 103. In addition, a surface area of the outer top surface 80bt of the heat dissipation member 80" may be increased by the first and second fin portions 80f1 and 80f2, and thus a heat dissipation effect may be improved.

Figure 11:
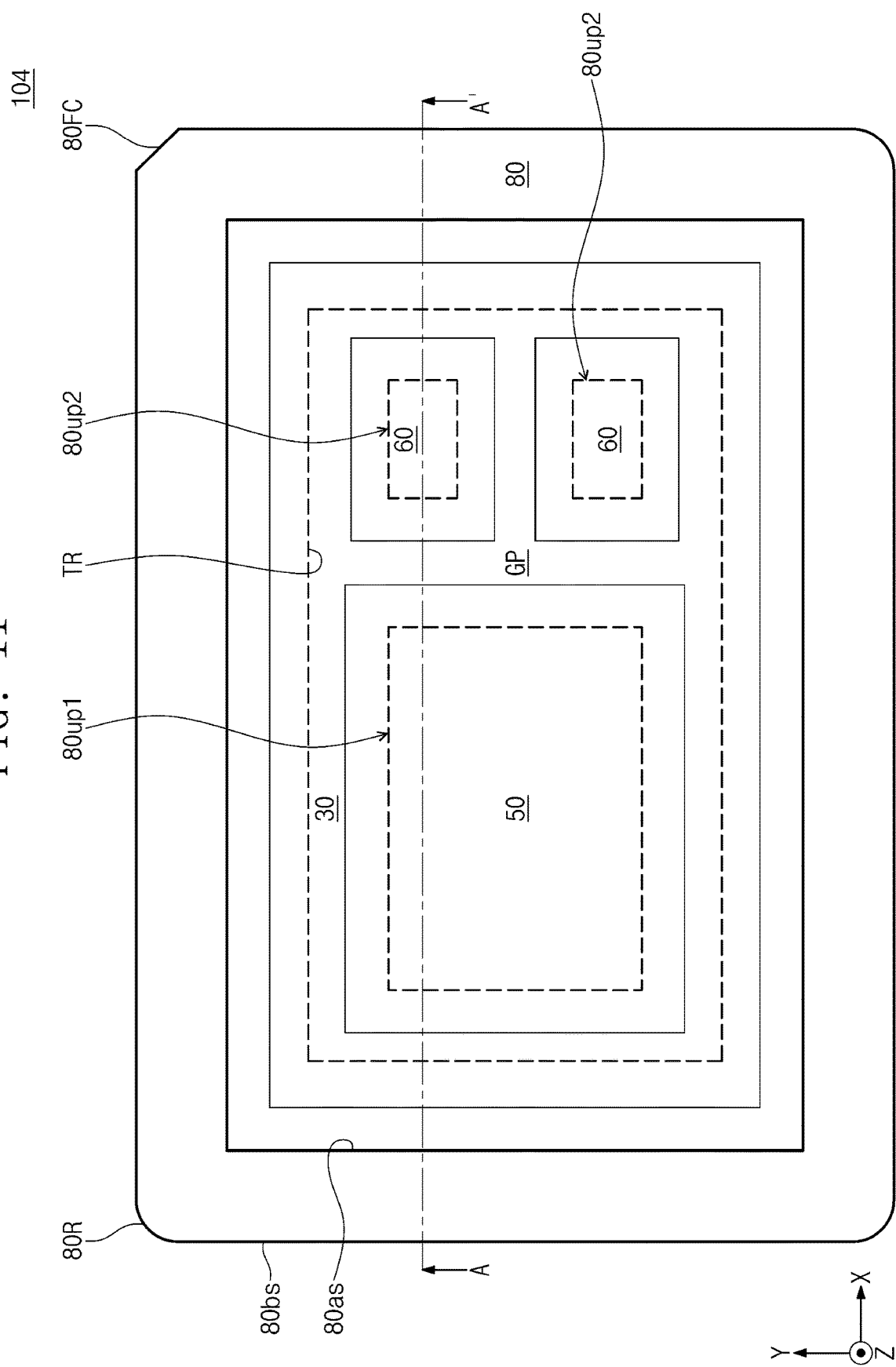
FIG. 11 is a plan view illustrating a semiconductor package according to some embodiments.

FIG. 11 is a plan view illustrating a semiconductor package according to some embodiments. A cross-sectional view taken along line A-A' of FIG. 11 may be the same/similar to that of FIG. 9 or 10.

Referring to FIG. 11, in a semiconductor package 104 according to the present embodiments, a trench TR may overlap with an entire circumference (or edge) of the first chip structure 50. In addition, the trench TR may overlap with an entire circumference (or edge) of the second chip structure 60. Thus, each of first and second heat dissipation inner protrusions 80up1 and 80up2 may have a planar structure of an isolated island shape. Other structures and/or components may be the same/similar as described with reference to FIGS. 8 to 10.

Figure 12:
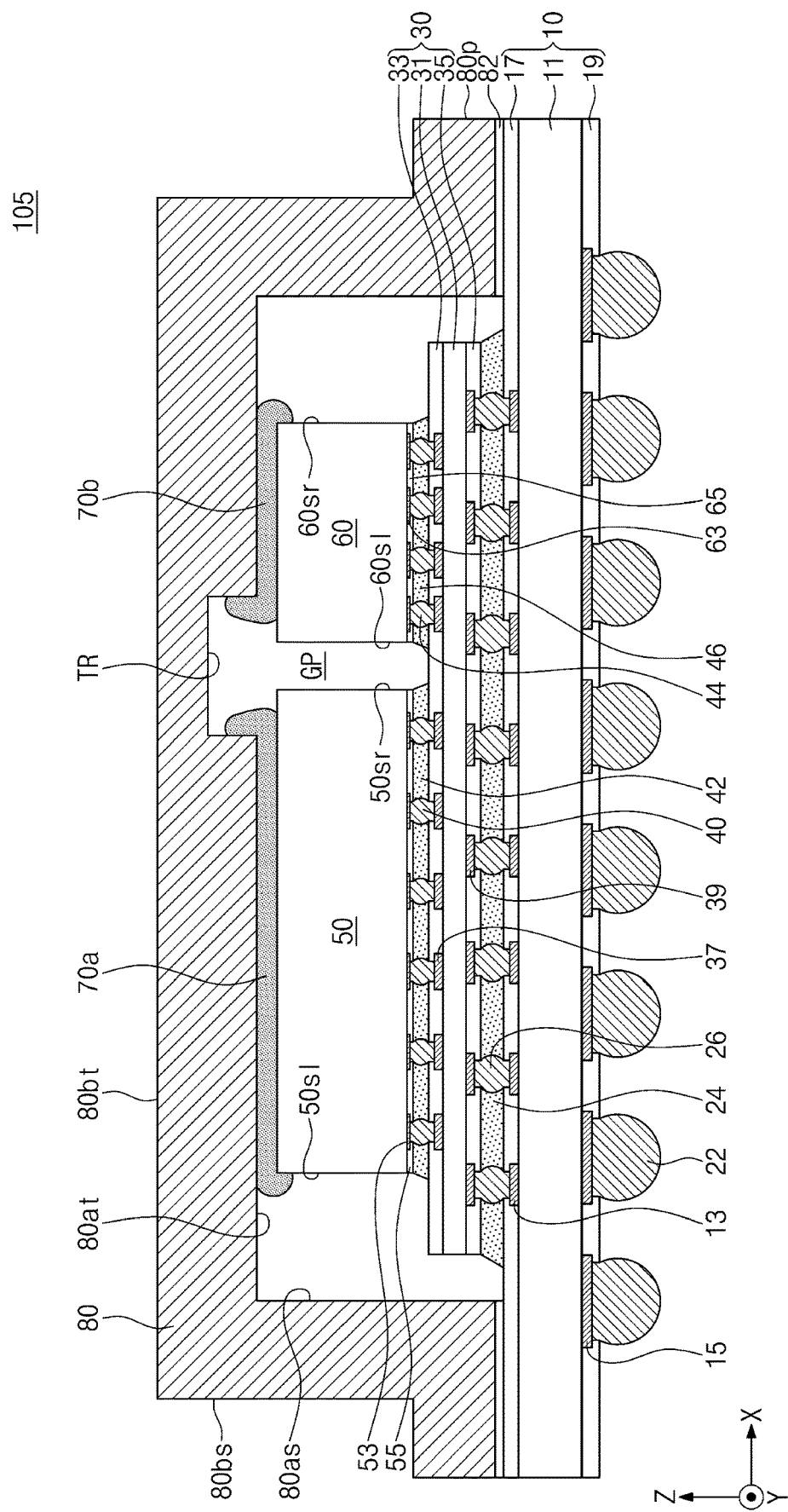
FIG. 12 is a cross-sectional view illustrating a semiconductor package according to some embodiments.

FIG. 12 is a cross-sectional view illustrating a semiconductor package according to some embodiments.

Referring to FIG. 12, the heat dissipation member 80 of a semiconductor package 105 according to the present embodiments may have the structure of FIG. 2 and may further include a lower side protrusion 80p protruding outward from a lower portion of the outer sidewall 80bs. The heat dissipation member 80 may have a cross section having, e.g., a hat shape. Since the heat dissipation member 80 includes the lower side protrusion 80p, an adhesion surface between the first substrate 10 and the heat dissipation member 80 may be increased to improve adhesive strength between the first substrate 10 and the heat dissipation member 80. Other components may be the same/similar as described with reference to FIGS. 1 to 5.

Figure 13:
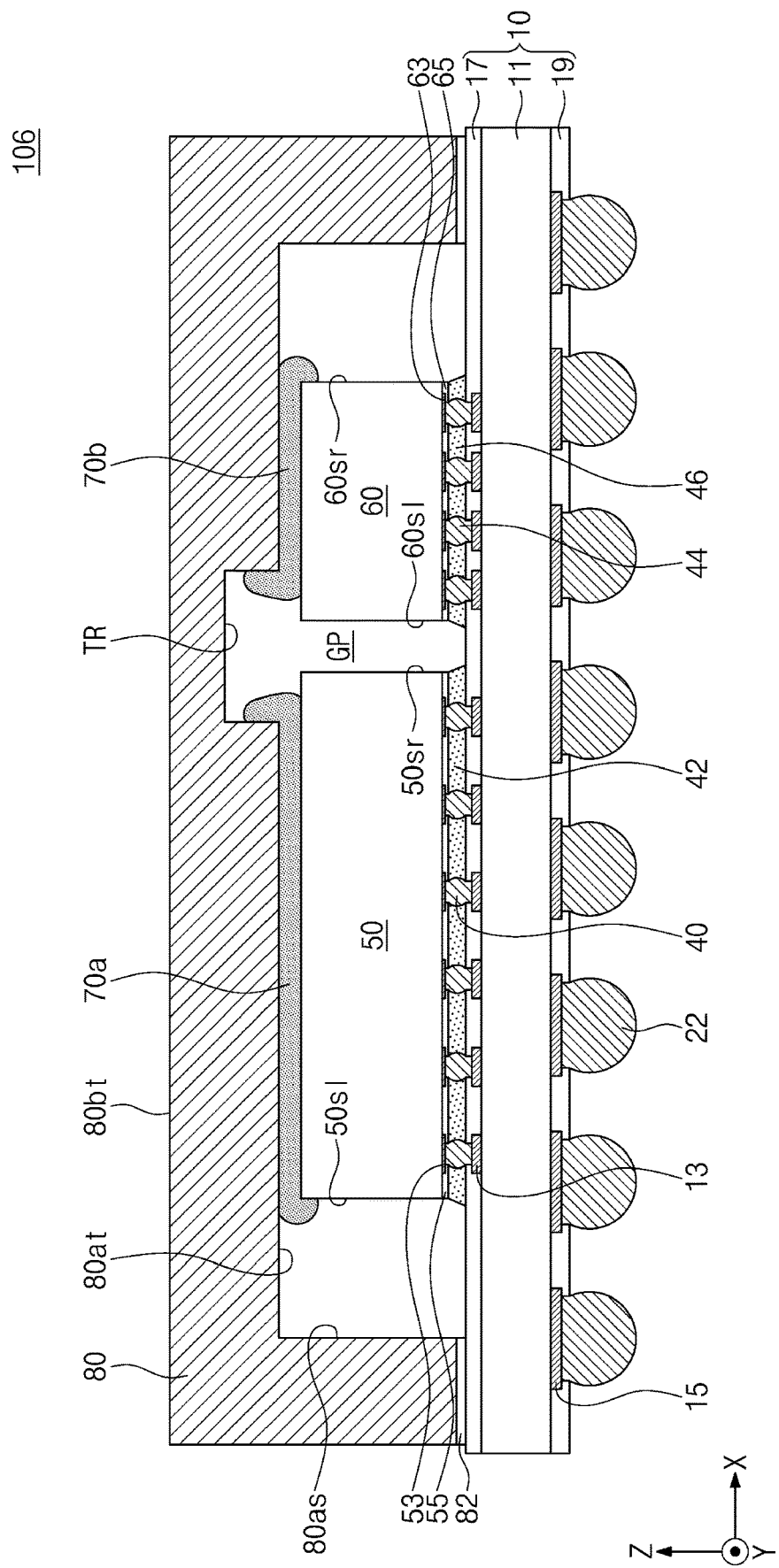
FIG. 13 is a cross-sectional view illustrating a semiconductor package according to some embodiments.

FIG. 13 is a cross-sectional view illustrating a semiconductor package according to some embodiments.

Referring to FIG. 13, in a semiconductor package 106 according to the present embodiments, the second substrate 30 of FIG. 2 may be omitted and the first chip structure 50 may be mounted directly on the first substrate 10 with the second internal connection terminals 40 interposed therebetween. In addition, the second chip structure 60 may be mounted directly on the first substrate 10 with the third internal connection terminals 44 interposed therebetween, without the second substrate 30. Other structures and/or components may be the same/similar as described with reference to FIGS. 1 to 5.

Figure 14:
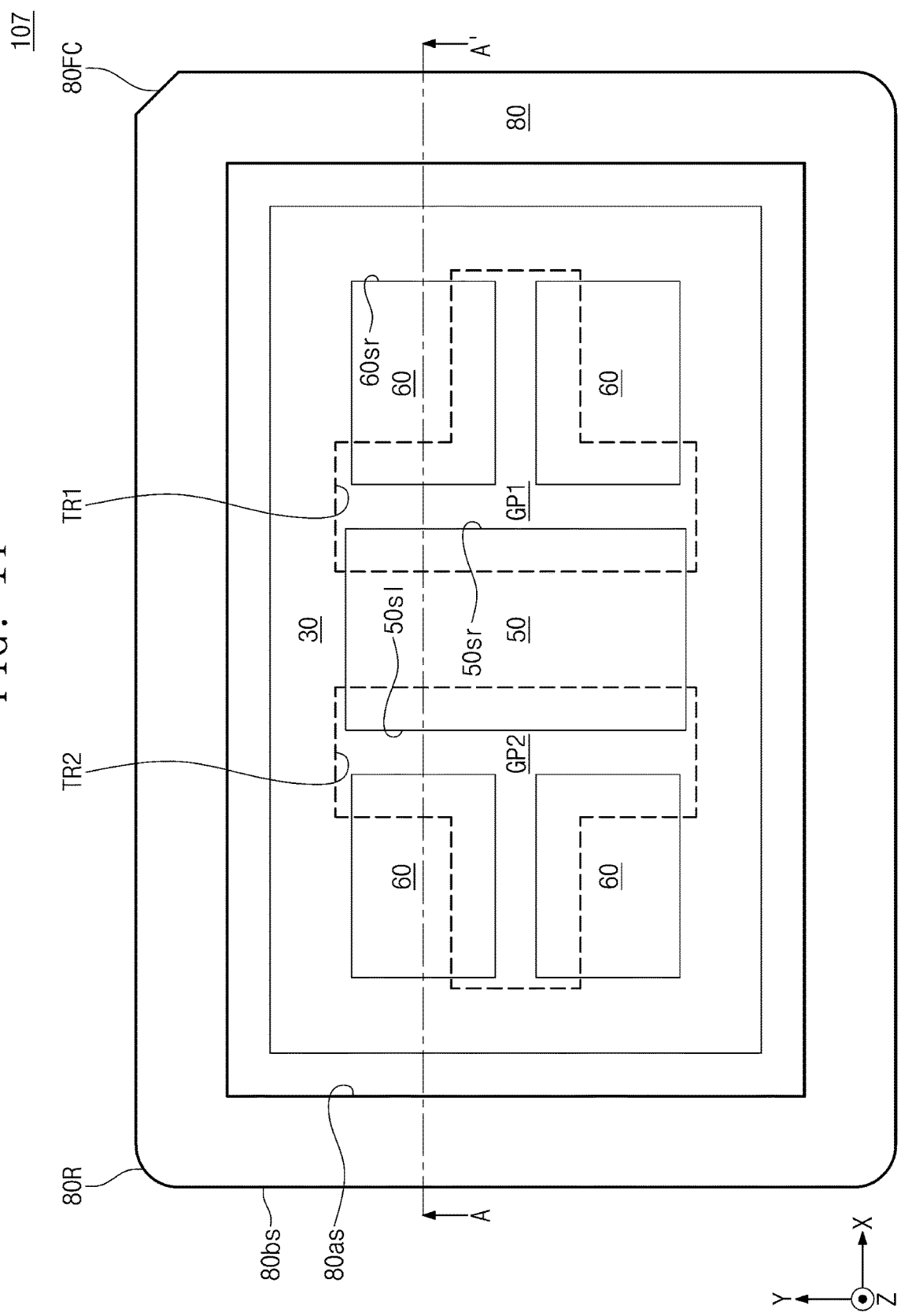
FIG. 14 is a plan view illustrating a semiconductor package according to some embodiments.
Figure 15:
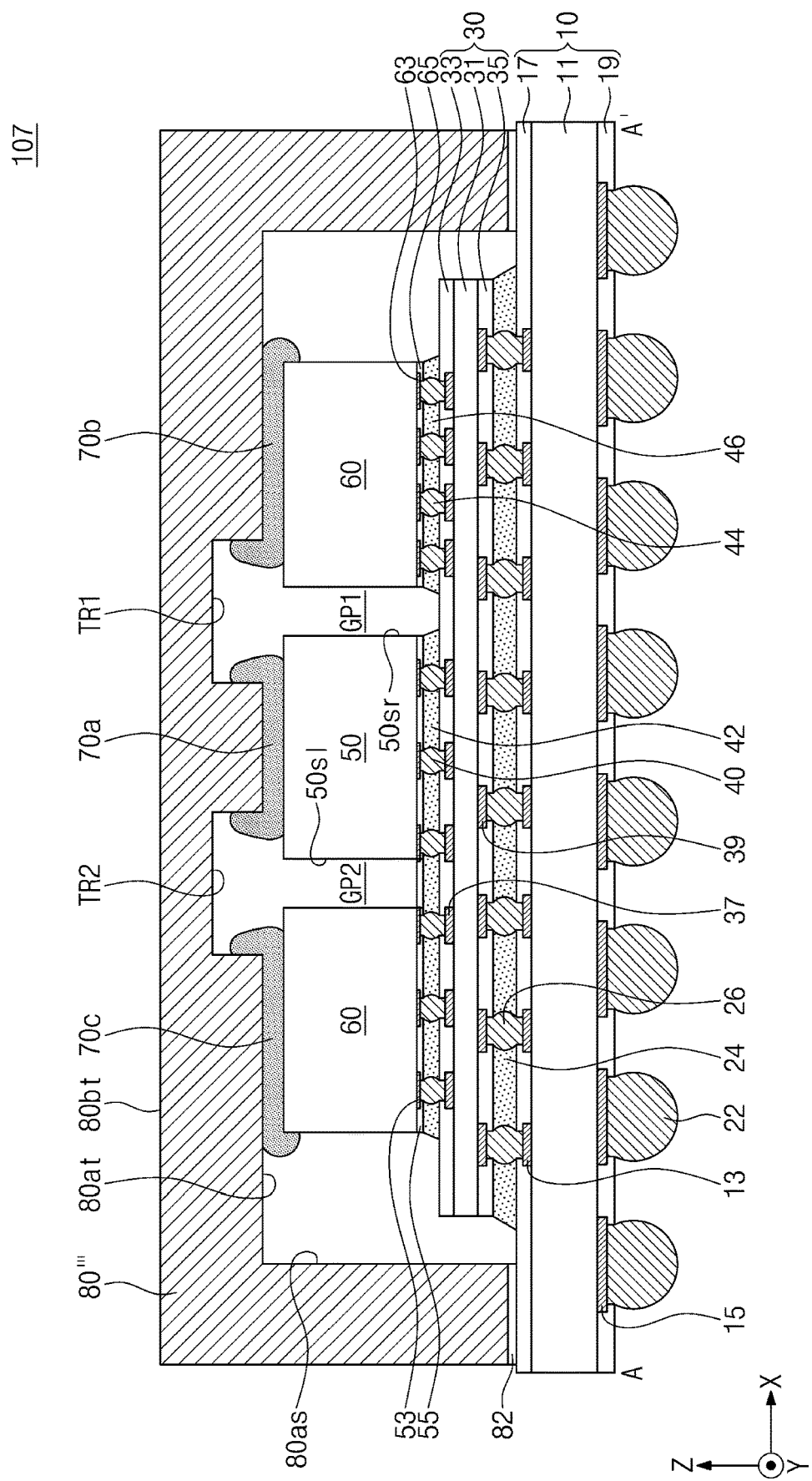
FIG. 15 is a cross-sectional view along line A-A' of FIG. 14 according to some embodiments.

FIG. 14 is a plan view illustrating a semiconductor package according to some embodiments. FIG. 15 is a cross-sectional view taken along line A-A' of FIG. 14.

Referring to FIGS. 14 and 15, in a semiconductor package 107 according to the present embodiments, two second chip structures 60 may be disposed adjacent to the first chip right sidewall 50sr of the first chip structure 50, and two second chip structures 60 may be disposed adjacent to the first chip left sidewall 50s1 of the first chip structure 50. A first gap region GP1 may exist between the first chip right sidewall 50sr of the first chip structure 50 and the second chip structures 60 adjacent thereto. A second gap region GP2 may exist between the first chip left sidewall 50s1 of the first chip structure 50 and the second chip structures 60 adjacent thereto. A heat dissipation member 80''' may have a first trench TR1 overlapping with the first gap region GP1, and a second trench TR2 overlapping with the second gap region GP2. The first trench TR1 and the second trench TR2 may be spaced apart from each other and may have symmetrical shapes. A structure of each of the first and second trenches TR1 and TR2 may be the same/similar as that of the trench TR described with reference to FIGS. 1 to 5.

By way of summation and review, embodiments provide a semiconductor package with improved reliability. That is, the semiconductor package, according to embodiments, includes a heat dissipation member with a trench structure that inhibits/prevents thermal interface material layers from entering a gap region between the chip structures. Thus, the underfill layer and the thermal interface material layer may be spaced apart from each other to prevent a defect (e.g., a crack) caused by differences in physical properties between the underfill layer and the thermal interface material layer. As a result, the reliability of the semiconductor package may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a first substrate;
   a first chip structure and a second chip structure spaced apart from each other on the first substrate, a gap region being defined between the first and second chip structures; and
   a heat dissipation member covering the first chip structure, the second chip structure, and the first substrate, the heat dissipation member including a first trench in an inner top surface of the heat dissipation member,
   wherein the first trench vertically overlaps with the gap region, a width between directly facing inner sidewalls of the first trench being greater than a width of the gap region, and
   wherein the first trench vertically overlaps with at least a portion of a top surface of the first chip structure or a portion of a top surface of the second chip structure.

2. The semiconductor package as claimed in claim 1, further comprising:
   a first thermal interface material layer between the first chip structure and the heat dissipation member, the first thermal interface material layer extending horizontally on the top surface of the first chip structure and vertically on a first of the facing inner sidewalls of the first trench; and
   a second thermal interface material layer between the second chip structure and the heat dissipation member, the second thermal interface material layer extending horizontally on the top surface of the second chip structure and vertically on a second of the facing inner sidewalls of the first trench, and the first thermal interface material layer being spaced apart from the second thermal interface material layer.

3. The semiconductor package as claimed in claim 2, wherein at least a portion of an inner top surface of the first trench is not in contact with the first and second thermal interface material layers but is exposed.

4. The semiconductor package as claimed in claim 1, wherein the heat dissipation member has a first thickness at a position spaced apart from the first trench, the first trench having a first depth from the inner top surface of the heat dissipation member, and the first depth ranging from 1/3 to 2/3 of the first thickness.

5. The semiconductor package as claimed in claim 1, wherein the first trench has a first depth from the inner top surface of the heat dissipation member, the top surface of the first chip structure, which overlaps with the first trench, having a first width smaller than the first depth of the first trench.

6. The semiconductor package as claimed in claim 1, wherein the first trench includes:
   an entrance portion, at which the facing inner sidewalls meet the inner top surface of the heat dissipation member, the entrance portion having a cross section which is right-angled, rounded, or stepped-shaped.

7. The semiconductor package as claimed in claim 1, wherein the heat dissipation member includes three round corners and one faceted corner having a facet, when viewed in a plan view.

8. The semiconductor package as claimed in claim 1, wherein:
   the first chip structure includes:
      a first chip sidewall adjacent to the second chip structure, the first trench overlapping the first chip sidewall, and
      a second chip sidewall opposite the first chip sidewall, and
   the heat dissipation member further includes a second trench in the inner top surface of the heat dissipation member, the second trench overlapping the second chip sidewall.

9. The semiconductor package as claimed in claim 8, wherein:
   the heat dissipation member includes a first inner protrusion between the first trench and the second trench, the first inner protrusion having a first width in a first direction, and
   the first chip structure has a second width in the first direction, the first width being less than the second width.

10. The semiconductor package as claimed in claim 1, wherein the heat dissipation member further includes a first fin portion protruding upward from an outer top surface opposite to the inner top surface, the first fin portion overlapping the first trench.

11. The semiconductor package as claimed in claim 1, wherein:
    an outer top surface of the heat dissipation member is uneven, and
    the heat dissipation member has a first thickness at a position spaced apart from the first trench and has a second thickness on the first trench, the first thickness being equal to the second thickness.

12. The semiconductor package as claimed in claim 1, further comprising a second substrate between the first chip structure and the first substrate and between the second chip structure and the first substrate, a first distance from an inner sidewall of the heat dissipation member to the second substrate is less than a second distance from the inner sidewall of the heat dissipation member to the first chip structure.

13. The semiconductor package as claimed in claim 1, wherein the at least portion of the top surface of the first chip structure or the top surface of the second chip structure extends horizontally beyond a corresponding one of the inner sidewalls of the first trench to vertically overlap with an interior of the first trench, the first trench exposing the at least portion of the top surface of the first chip structure or the top surface of the second chip structure.

14. A semiconductor package, comprising:
 a package substrate;
 an interposer substrate on the package substrate;
 a first chip structure and a second chip structure on the interposer substrate, the first chip structure and the second chip structure being spaced apart from each other with a gap region therebetween; and
 a heat dissipation member covering the first chip structure, the second chip structure, the interposer substrate, and the package substrate, the heat dissipation member being adhered to a top surface of the package substrate,
 wherein the heat dissipation member includes a first trench in an inner top surface of the heat dissipation member, the first trench overlapping with the gap region, and a width between directly facing sidewalls of the first trench being greater than a width of the gap region,
 wherein the first trench vertically overlaps with a portion of a top surface of the first chip structure and a portion of a top surface of the second chip structure, and
 wherein the heat dissipation member has a first thickness at a portion spaced apart from the first trench, and a depth of the first trench ranges from 1/3 to 2/3 of the first thickness.

15. The semiconductor package as claimed in claim 14, further comprising:
 a first thermal interface material layer between the first chip structure and the heat dissipation member, the first thermal interface material layer extending horizontally on the top surface of the first chip structure and vertically on a first of the facing inner sidewalls of the first trench; and
 a second thermal interface material layer between the second chip structure and the heat dissipation member, the second thermal interface material layer extending horizontally on the top surface of the second chip structure and vertically on a second of the facing inner sidewalls of the first trench, and at least a portion of an inner top surface of the first trench is not in contact with the first and second thermal interface material layers but is exposed.

16. The semiconductor package as claimed in claim 14, wherein the top surface of the first chip structure, which overlaps with the first trench, has a first width smaller than the depth of the first trench.

17. The semiconductor package as claimed in claim 14, wherein an outer top surface of the heat dissipation member is uneven.

18. The semiconductor package as claimed in claim 14, wherein the heat dissipation member includes three round corners and one faceted corner having a facet, when viewed in a plan view.

19. A semiconductor package, comprising:
 a first substrate;
 a first chip structure and a second chip structure spaced apart from each other on the first substrate, a gap region being defined between the first and second chip structures; and
 a heat dissipation member covering the first chip structure, the second chip structure, and the first substrate, the heat dissipation member including a first trench overlapping with the gap region, and a width between directly facing sidewalls of the first trench being greater than a width of the gap region,
 wherein the heat dissipation member includes three first outer corners and one second outer corner, the second outer corner having a different shape from that of the first outer corner.

20. The semiconductor package as claimed in claim 19, wherein the first chip structure includes a first chip sidewall adjacent to the second chip structure, and a second chip sidewall opposite to the first chip sidewall, the first trench overlapping with the first chip sidewall, and the heat dissipation member further including a second trench overlapping with the second chip sidewall.

* * * * *